(12) United States Patent  
Gines

(10) Patent No.: US 12,188,963 B1  
(45) Date of Patent: Jan. 7, 2025

(54) NOISE REDUCTION OF OSCILLOSCOPE WAVEFORMS

(71) Applicant: Keysight Technologies, Inc., Santa Rosa, CA (US)

(72) Inventor: David L. Gines, Fort Collins, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 188 days.

(21) Appl. No.: 17/946,538

(22) Filed: Sep. 16, 2022

(51) Int. Cl.  
*G01R 13/02* (2006.01)

(52) U.S. Cl.  
CPC .................................. *G01R 13/02* (2013.01)

(58) Field of Classification Search  
CPC ........................................................ G01R 13/02  
USPC .......................................................... 375/350  
See application file for complete search history.

(56) References Cited

U.S. PATENT DOCUMENTS

| | | | |
|---|---|---|---|
| 10,097,222 B2 | 10/2018 | Pickerd et al. | |
| 10,432,434 B2 | 10/2019 | Pickerd et al. | |
| 2017/0292977 A1 | 10/2017 | Pickerd et al. | |
| 2018/0026816 A1* | 1/2018 | Pickerd | H04L 25/03828 375/232 |
| 2018/0123626 A1* | 5/2018 | Pickerd | G01R 13/0272 |
| 2021/0405090 A1 | 12/2021 | Zhao et al. | |

* cited by examiner

*Primary Examiner* — Fitwi Y Hailegiorgis

(57) ABSTRACT

An oscilloscope includes a memory that stores instructions; and a processor that executes the instructions. When executed by the processor, the instructions cause the oscilloscope to obtain a measurement of a first radio frequency signal; split a first spectrum based on the first radio frequency signal into a first low-frequency band and a first high-frequency band; perform a first Fourier transform to compute a first new spectrum based on the first spectrum; compute a first waveform of the first new spectrum with noise of the oscilloscope reduced by performing a first inverse Fourier transform based on the first new spectrum; and combine the first new spectrum with noise of the oscilloscope reduced with the first low-frequency band.

20 Claims, 13 Drawing Sheets

NOISE REDUCTION OF OSCILLOSCOPE WAVEFORMS

BACKGROUND

Real-time oscilloscopes are used to characterize high-speed digital data. Testing by real-time oscilloscopes is a part of several industry protocols, such as universal serial bus (USB), ethernet or peripheral component interconnect express (PCIe), which rely on data processing algorithms and statistical methods to determine compliance. Acceptable levels of performance, for a wide variety of metrics, are defined in official specifications for industry protocols.

Noise is perhaps the most fundamental metric to be measured. Noise can be divided into two broad categories, waveform noise such as voltage noise/vertical noise, and timing noise such as jitter/horizontal noise. Oscilloscopes which are used to make these measurements have their own source of noise which can corrupt measurements made by the oscilloscopes. As long as the oscilloscope noise is small in comparison to the noise to be measured, this is not a problem. Noise levels to be measured by oscilloscopes are growing increasingly smaller, and therefore oscilloscope noise becomes an increasingly important factor. Without any way to remove the oscilloscope noise, customer devices under test (DUTs) may fail to comply with modern official specifications for industry protocols. Early noise reduction methods involve subtracting oscilloscope noise directly only for scalar measurements, but require end-users to estimate the oscilloscope noise in a separate, manual procedure. These early noise reduction methods work only for scalar measurements, and not for histograms, frequency spectra, time trends, eye diagrams, etc.

A noise measurement may be represented by a scalar number. For example, when measuring the amount of random jitter on a digital data waveform, the random jitter may be represented by a scalar statistic and oscilloscope noise can be subtracted directly from the digital data waveform. However, the oscilloscope noise must be estimated through a calibration procedure, and if jitter is the desired measurement, the voltage noise/vertical noise of the oscilloscope will need to be converted to jitter/horizontal noise, which also requires measuring the change of voltage over time (i.e., the slew rate) of the data waveform. Additionally, this method assumes the oscilloscope noise is uncorrelated with the noise from the DUT, which is not always true. Moreover, the oscilloscope noise must be much smaller than the noise from the DUT, or else the process is overly sensitive to small errors, and results can vary wildly.

More importantly, not all noise measurements are represented by scalar numbers. For example, simple subtraction is not workable for some representations of noise measurements such as histograms, frequency spectra, time trends, and eye diagrams. Currently, oscilloscope noise is not removed from general waveform data for signals from DUTs. Jitter trend data is a list of timing errors for each data bit. While oscilloscope noise may be removed from jitter trend data, there is not yet any mechanism to remove oscilloscope noise from general waveform data, and even the methods of removing oscilloscope noise from jitter trend data require physically splitting the measured signal for input into two separate channels on the oscilloscope. This can be cumbersome and disruptive to the measurement process at best, simply not possible at worst, and may introduce errors due to cables not being matched, and due to non-ideal connectors.

Additionally, reliance on the frequency domain when reducing oscilloscope noise may present a vulnerability in that substantial distortions at the waveform start and end may be created due to the nature of Fourier transforms. As background, the only way to compute a true Fourier transform of an aperiodic signal is when a data set is infinitely long. In modern digital signal processing, fast Fourier transforms (FFTs) are used as an approximation for data sets with adequate lengths. However, when the data set is not adequately long compared to its lowest frequency components, and when an inverse fast Fourier transform (IFFT) is used to return to the time domain, Gibb's phenomenon creates large distortions in the data, especially at the edges. Gibb's phenomenon may be avoided when there is no need to return to the time domain, but the process must return back to the time domain in order to create a waveform with oscilloscope noise removed.

In some contexts for signal processing, Gibb's phenomenon is avoided through the use of windowing which involves multiplying a window function with the data set before computing the fast Fourier transform. Window functions typically have a value of 1, or unity, in the middle, and taper off smoothly towards zero at the edges. But windowing does not work for cross-correlation algorithms. For one, after returning to the time domain, the windowing must be reversed in order to restore the shape of the original waveform. In other words, the window function must be applied as a denominator. Since most window functions taper to zero at edges, this involves dividing by zero, or numbers which are nearly zero, which is an ill-posed problem and creates distortion at the edges similar to Gibb's phenomenon.

SUMMARY

According to an aspect of the present disclosure, an oscilloscope includes a memory that stores instructions; and a processor that executes the instructions. When executed by the processor, the instructions cause the oscilloscope to obtain a measurement of a first radio frequency signal; split a first spectrum based on the first radio frequency signal into a first low-frequency band and a first high-frequency band; perform a first Fourier transform to compute a first new spectrum based on the first spectrum; compute a first waveform of the first new spectrum with noise of the oscilloscope reduced by performing a first inverse Fourier transform based on the first new spectrum; and combine the first new spectrum with noise of the oscilloscope reduced with the first low-frequency band.

According to another aspect of the present disclosure, a tangible non-transitory computer-readable storage medium stores a computer program. The computer program, when executed by a processor, causes a system to: obtain a measurement of a first radio frequency signal; split a first spectrum based on the first radio frequency signal into a first low-frequency band and a first high-frequency band; perform a first Fourier transform to compute a first new spectrum based on the first spectrum; compute a first waveform of the first new spectrum with noise of the system reduced by performing a first inverse Fourier transform based on the first new spectrum; and combine the first new spectrum with noise of the system reduced with the first low-frequency band.

According to another aspect of the present disclosure, a system includes a memory that stores instructions; and a processor that executes the instructions. When executed by the processor, the instructions cause the system to obtain a measurement of a first radio frequency signal; split a first spectrum based on the first radio frequency signal into a first low-frequency band and a first high-frequency band; perform a first Fourier transform to compute a first new spectrum based on the first spectrum; compute a first waveform of the first new spectrum with noise of the system reduced by performing a first inverse Fourier transform based on the first new spectrum; and combine the first new spectrum with noise of the system reduced with the first low-frequency band.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
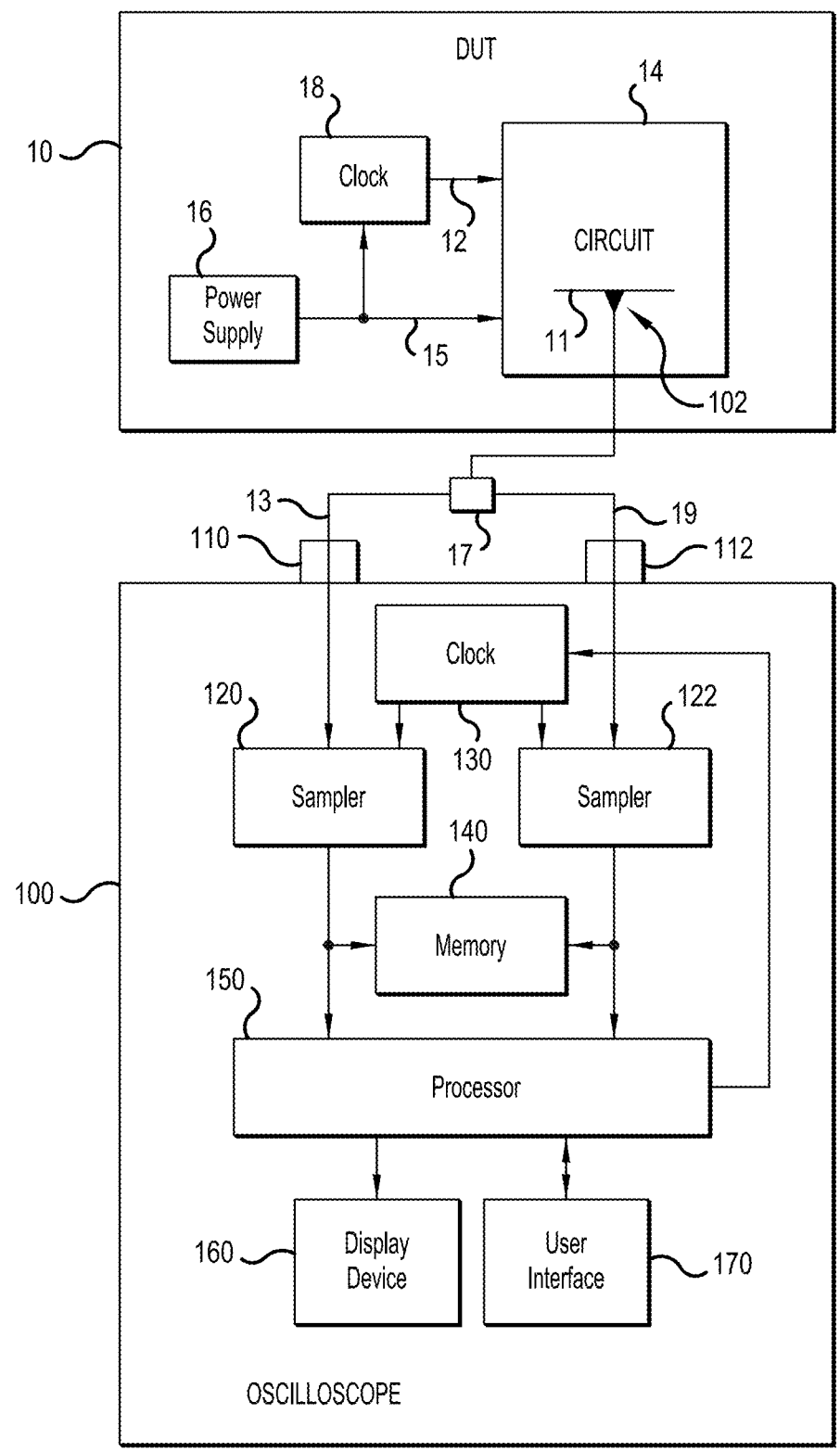
FIG. 1A illustrates a simplified block diagram of a measurement system for improved noise reduction of oscilloscope waveforms, in accordance with a representative embodiment.

In the following detailed description, for the purposes of explanation and not limitation, representative embodiments disclosing specific details are set forth in order to provide a thorough understanding of embodiments according to the present teachings. However, other embodiments consistent with the present disclosure that depart from specific details disclosed herein remain within the scope of the appended claims. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. Definitions and explanations for terms herein are in addition to the technical and scientific meanings of the terms as commonly understood and accepted in the technical field of the present teachings.

It will be understood that, although the terms first, second, third etc. may be used herein to describe various elements, components or signals, these elements, components or signals should not be limited by these terms. These terms are only used to distinguish one element, component or signal from another element, component or signal. Thus, a first element, component or signal discussed below could be termed a second element, component or signal without departing from the teachings of the inventive concept(s) described herein.

As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

The present disclosure, through one or more of its various aspects, embodiments and/or specific features or sub-components, is thus intended to bring out one or more of the advantages as specifically noted below.

As described herein, oscilloscope noise may be removed from a measured waveform of a signal from a device under test (DUT), while still leaving the noise from the signal from the DUT which is the target of the measurements by the oscilloscope. Results of removing the oscilloscope noise include effectively lowering the noise floor of the oscilloscope through software and improving accuracy of oscilloscope measurements.

The teachings herein provide a way to eliminate, or at least mitigate distortion, from low-frequency components of measured signals, and thus enable mechanisms for removing oscilloscope noise from a signal from a DUT while still leaving the DUT noise which is the desired measurement. That is, the methods described herein are applicable to methods for removing oscilloscope noise in the presence of low-frequency components in DUT signals.

FIG. 1A illustrates a system 100 for improved noise reduction of oscilloscope waveforms, in accordance with a representative embodiment.

The system 100 in FIG. 1A may be used to sample signals from a DUT 10 (device under test). The DUT 10 may be a mobile communication device such as a smartphone, tablet, or mobile computer. The signals from the DUT 10 that are sampled by the system 100 may be radio frequency signals. Here, the DUT 10 is an example and includes an output 11, a circuit 14 that includes the output 11, for example a high speed digital communication circuit, at least one instance of a power supply 16, and at least one instance of a clock 18. The circuit 14 is powered by one or more supply voltages including a first signal 15 produced by power supply 16. Circuit 14 also receives a clock signal 12 from clock 18. The output 11 outputs a signal. The DUT 10 may include multiple different outputs including the output 11, and one or more of such multiple different outputs may each output a different signal.

A power splitter 17 may be a component of the DUT 10, may be separately provided between the DUT 10 and the system 100 as shown, or may be a component of the system 100. The power splitter 17 may receive the signal from the output 11 of the DUT 10 via a probe 102, and split the received signal into a first signal 13 and a second signal 19. The signal from the output 11 may be a radio frequency signal such that the first signal 13 may be a first radio frequency signal and the second signal 19 may be a second radio frequency signal.

In some embodiments, system 100 may be a digital oscilloscope. System 100 may include: a probe 102 that interfaces with the output 11 of the DUT to receive the signal from the output 11; a first input 110 configured to receive (e.g., via a probe 102 and the power splitter 17) the first signal 13 from the DUT 10; a first sampler 120 configured to capture samples of the received supply voltage of the first signal 13; a second input 112 configured to receive (e.g., via the probe 102 and the power splitter 17) the second signal 19 from DUT 10; a second sampler 122 configured to capture samples of the received supply voltage of the second signal 19; memory 140 and a signal processor 150.

The first signal 13 may be a first radio frequency signal, and may be received over a first channel that includes the probe 102, the power splitter 17, the first input 110, and the first sampler 120. The first signal 13 may be carried over one or more wires between the output 11 and the power splitter 17, and between the power splitter 17 and the first input 110. The second signal 19 may be a second radio frequency signal, and may be received over a second channel that includes the probe 102, the power splitter 17, the second input 112, and the second sampler 122. The second signal 19 may be carried over one or more wires between the output 11 and the power splitter 17, and between the power splitter 17 and the second input 112. Although FIG. 1A shows a single instance of the probe 102 interfacing a single instance of the output 11 of the DUT 10 to probe an output signal, the system 100 may include multiple probes each interfacing different individual corresponding instances of such outputs of the DUT 10. For example, different output ports of the DUT 10 may output different signals probed by different probes of the system 100. The output 11 outputs a radio frequency signal. An example of the output 11 is an antenna or antenna array of the DUT 10. In some embodiments, each of first sampler 120 and second sampler 122 may include an analog-to-digital converter (ADC) which may be clocked in response to a clock 130 of the system 100. In some embodiments, only one of the first channel or the second channel are used during active testing of the DUT. In some embodiments, the system 100 only includes the first channel and not the second or any other channel.

System 100 may include a display device 160 and a user interface 170. Display device 160 may include a liquid crystal display (LCD), a plasma display, a cathode ray tube (CRT), etc. User interface 170 may include one or more of: an interactive screen with soft buttons/keys, a keyboard, a keypad, control knobs, a mouse, a trackball, buttons, and/or indicator lights. System 100 may include other components and subsystems not illustrated in FIG. 1A.

Memory 140 may store instructions such as one or more comprehensive computer programs comprising executable instructions and/or individual algorithms comprising executable instructions. The signal processor 150 may process the executable instructions to implement some or all aspects of methods attributed to the system 100 herein. In the system 100, the combination of the memory 140 and the signal processor 150 may be elements of a controller. The memory 140 may also store therein digitized samples of the first signal 13 captured by first sampler 120 and digitized samples of the second signal 19 captured by the second sampler 122. In some embodiments, the digitized samples may be communicated by system 100 via a communications interface (also not shown) to an external device such as a computer where the digitized samples may be processed. The communication interface may be any suitable interface, for example conforming to a standard such as Ethernet. In some embodiments, the communication interface may allow the system 100 to communicate commands and data to one or more external computers and/or other measurement instruments via the Internet.

A controller may include more elements than the memory 140 and the signal processor 150 depicted in FIG. 1A. The memory 140 may include a main memory and/or a static memory, where such memories may communicate with each other via one or more buses. The memory 140 may be implemented by any number, type and combination of random access memory (RAM) and read-only memory (ROM), for example, and may store various types of information, such as software algorithms, which serve as instructions, which when executed by the signal processor 150 cause the signal processor 150 to perform various steps and methods according to the present teachings. Furthermore, updates to the methods and processes described herein may also be stored in the memory 140. The various types of ROM and RAM may include any number, type and combination of computer-readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, Blu-ray disk, a universal serial bus (USB) drive, or any other form of storage medium known in the art. The memory 140 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term "non-transitory" specifically disavows fleeting characteristics such as characteristics of a carrier wave or signal or other forms that exist only transitorily in any place at any time. The memory 140 may be secure and/or encrypted, or unsecure and/or unencrypted.

The memory 140 is an example of computer-readable storage media, and should be interpreted as possibly being multiple memories. The memory 140 for instance may be multiple memories local to the system 100. A computer-readable storage medium is defined to be any computer-readable storage medium that constitutes patentable subject matter under 35 U.S.C. § 101 and excludes any computer-readable storage medium that does not constitute patentable subject matter under 35 U.S.C. § 101. Examples of such media include non-transitory media such as computer memory devices that store information in a format that is readable by a computer or data processing system. The signal processor 150 may be implemented by field programmable gate arrays (FPGAs), application specific integrated circuits (ASICs), systems on a chip (SOC), a central processing unit, a computer processor, a microprocessor, a graphics processing unit (GPU), a microcontroller, a state machine, programmable logic device, or combinations thereof, using any combination of hardware, software, firmware, hard-wired logic circuits, or combinations thereof. Additionally, the signal processor 150 is representative of one or more processors, and may include multiple processors, one or more multicore processor(s), parallel processors, and processors of different types. The term "processor" as used herein encompasses an electronic component able to execute a computer program or one or more individual machine executable instruction(s).

The display device 160 may be connected to a controller of the system 100 via a local wired interface. The display device 160 may be interfaced with the user interface 170 and other user input devices by which users can input instructions, including mouses, keyboards, thumbwheels and so on.

A controller of the system 100 may perform some of the operations described herein directly and may implement other operations described herein indirectly. For example, a controller may indirectly control operations such as by generating and transmitting content to be displayed on the display device 160. The controller may directly control other operations such as logical operations performed by the signal processor 150 executing instructions from the memory 140 based on input received from electronic elements and/or users via the interfaces. Accordingly, the processes implemented by the controller when the signal processor 150 executes instructions from the memory 140 may include steps not directly performed by the controller.

Figure 1B:
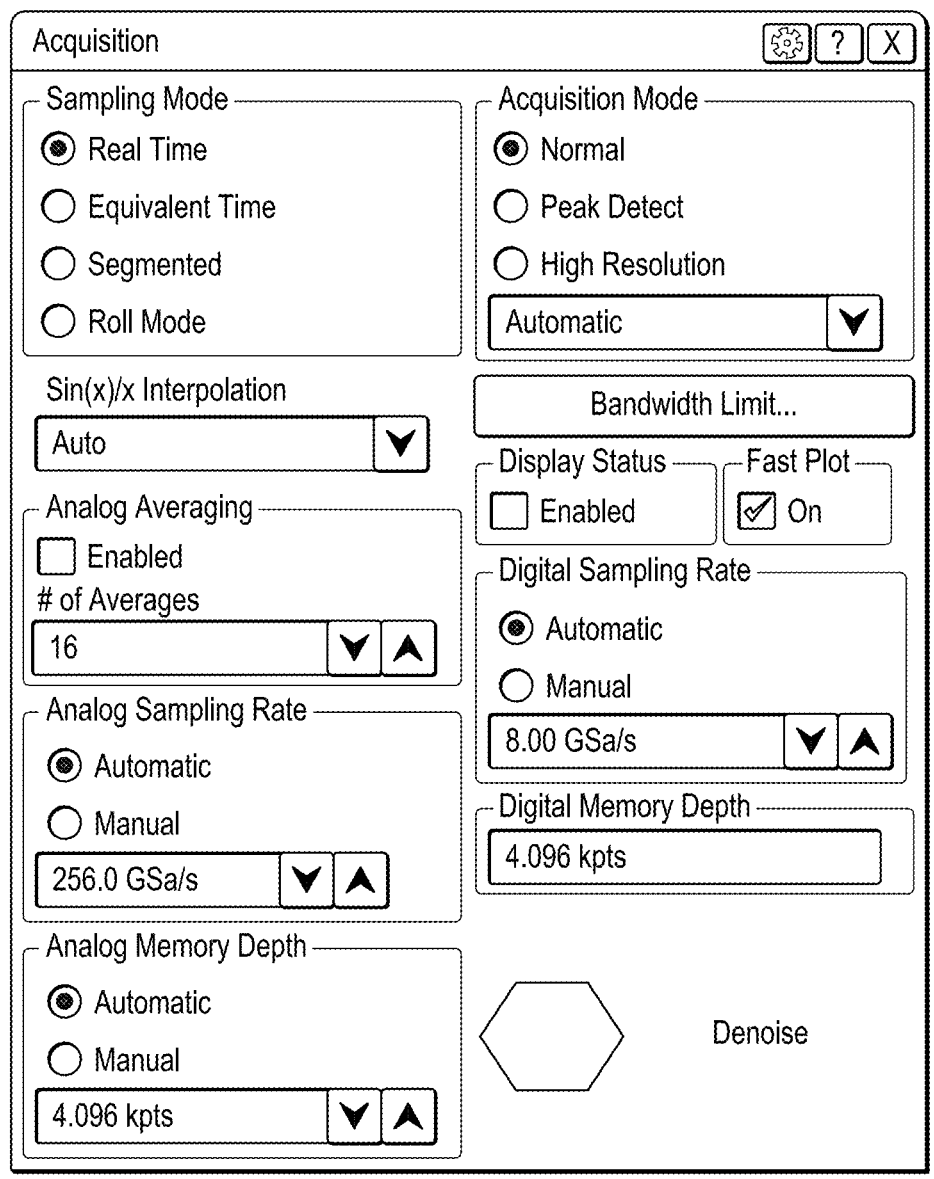
FIG. 1B illustrates a user interface for improved noise reduction of oscilloscope waveforms, in accordance with a representative embodiment.

FIG. 1B illustrates a user interface for improved noise reduction of oscilloscope waveforms, in accordance with a representative embodiment.

In FIG. 1B, a user interface 181 may be provided on the display device 160 or the user interface 170 in FIG. 1A, and may comprise a graphical user interface. For example, the user interface 170 may include a touch screen, and may display selectable options as shown in FIG. 1B via the user interface 181. On the lower right of the user interface 181, a "Denoise" icon may be selectable to instruct the system 100 to reduce oscilloscope noise when performing oscilloscope operations. The reduction of oscilloscope noise is described herein by methods shown in and described with respect to FIG. 2, FIG. 3 and FIG. 4. The methods of FIG. 2, FIG. 3 and FIG. 4 remove oscilloscope noise from a measured waveform of a signal from the output 11 of the DUT 10, rather than from a specific measurement such as jitter trends or histograms. Additionally, the removal of oscilloscope noise as described herein leaves noise from the signal output from the output 11 of the DUT 10. The noise from the signal output from the output 11 of the DUT 10 may be noise in radio frequency signals from the DUT 10, and the noise from the signal output from the output 11 of the DUT 10 may be the target of some processes implemented by the system 100.

Figure 2:
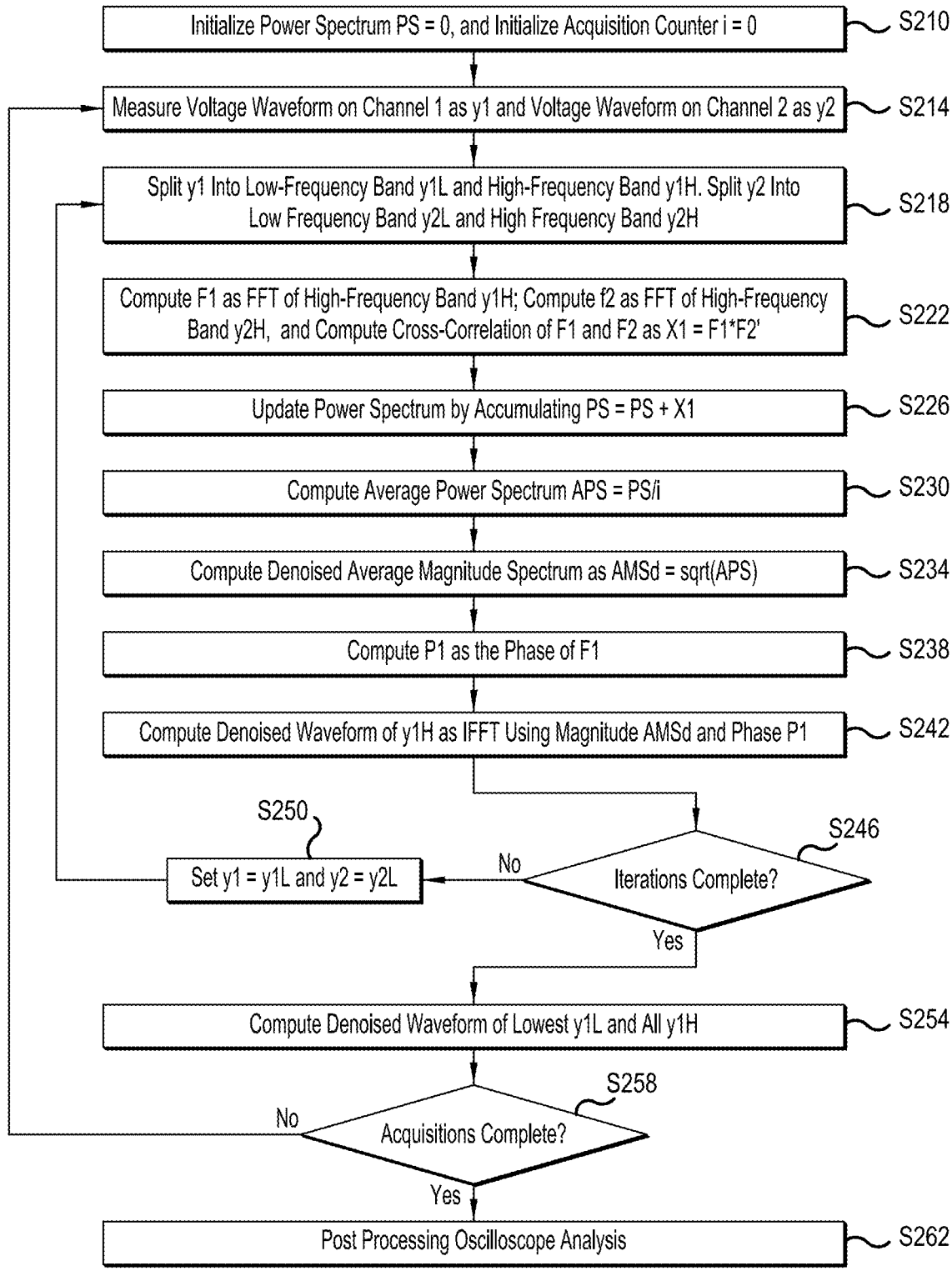
FIG. 2 illustrates a method for improved noise reduction of oscilloscope waveforms, in accordance with a representative embodiment.

FIG. 2 illustrates a method for improved noise reduction of oscilloscope waveforms, in accordance with a representative embodiment.

The method of FIG. 2 may be performed by the system 100 in FIG. 1A. The method of FIG. 2 starts at S210 when a power spectrum PS is initialized to 0, and an acquisition counter i is initialized to 0. The power spectrum PS may be initialized to 0 by the system 100 clearing a section of the memory 140 that will be used to store voltage waveform measurements from the first radio frequency signal and the second radio frequency signal from the DUT 10. For example, a section of flash memory may be erased as part of the initialization of the power spectrum PS to 0. The acquisition counter i may be initialized to 0 by clearing a section of the memory 140 that will be used to count acquisitions by the system 100. For example, a register in DRAM may be cleared to set the acquisition counter to 0.

At S214, a voltage waveform is measured on channel 1 as y1 and a voltage waveform is measured on channel 2 as y2. The measured voltage waveform y1 may be a waveform of a first radio frequency signal measured by the oscilloscope on channel 1 and may be equal to y+ys1 where y is the true waveform of the first radio frequency signal from the DUT 10 and ys1 is the random noise generated by the sampling circuitry on channel 1 of the system 100. The measured voltage waveform y2 may be a waveform of a second radio frequency signal measured by the oscilloscope on channel 2 and may be equal to y+ys2 where y is again the true waveform of the second radio frequency signal from the DUT 10 and ys2 is the random noise generated by the sampling circuitry on channel 2 of the system 100. For example, the probe 102 may receive a radio frequency signal from the DUT 10 and provide the received radio frequency signal to the first sampler 120 and the second sampler 122 as the first signal 13 and the second signal 19 via the power splitter 17. The measured voltage waveforms may reflect the waveforms of the first signal 13 and the second signal 19 as output by the first sampler 120 and the second sampler 122.

Figure 5:
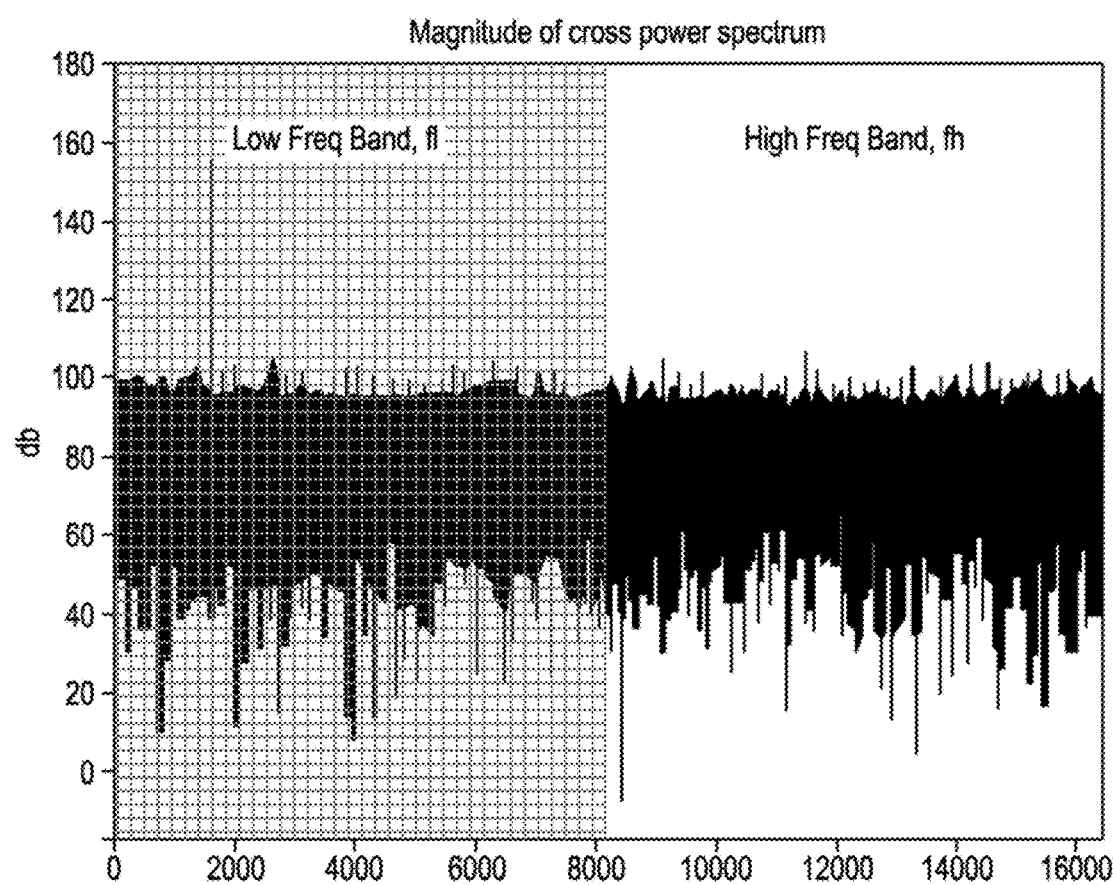
FIG. 5 illustrates a split power spectrum for improved noise reduction of oscilloscope waveforms, in accordance with a representative embodiment.

At S218, y1 is split into a low-frequency band waveform y1L and a high-frequency band waveform y1H. y2 is split into a low-frequency band waveform y2L and a high-frequency band waveform y2H. The splitting may be done using orthogonal sub-band coding methods, such as wavelet transforms. An example of the spectrum of evenly split frequency bands is illustrated in FIG. 5.

At S222, F1 is computed as a first Fourier transform of the high-frequency band waveform y1H and F2 is computed as a second Fourier transform of the high-frequency band waveform y2H. The Fourier transforms may be fast Fourier transform (FFTs), but the teachings herein are not limited to FFTs, and other forms of Fourier transform computations may alternatively be used. Oscilloscope noise from channel 1 and channel 2 are uncorrelated. The Fourier transforms may be computed for y1 and y2 at S222 separately to obtain F1 and F2. Also at S222, F1 and F2 may then be combined in the frequency domain by X1=F1×F2', where ' represents the complex conjugate and F1×F2' is the Fourier representation of the cross-correlation y1*y2, where * represents convolution. The noise component ys1 from the oscilloscope at channel 1 and ys2 from the oscilloscope at channel 2 are not correlated with each other so that the Fourier transformation of the cross-correlation removes the noise due to the measurement instrument, but it does not remove the noise due to the DUT 10. In embodiments based on FIG. 2, the cross-correlation of F1 and F2 is computed as X1.

At S226, X1 is used to update the power spectrum at S226. That is, the power spectrum is updated for each acquisition, so that the new power spectrum equals the previous power spectrum and X1 as computed at S222 for the current iteration. For the first acquisition, the power spectrum PS will be the initial power spectrum.

At S230, the average power spectrum APS is computed as the power spectrum divided by the current count i of the acquisition counter. For the first acquisition, the APS will simply be the initial power spectrum, whereas for subsequent acquisitions the APS will be an average of the accumulated power spectrum as calculated at S226. This method of computing an accumulated average by accumulating a sum and dividing by the count is the simplest approach, but other variations may also be used.

At S234, the denoised average magnitude spectrum is computed as AMSd=the square root of the average power spectrum APS computed at S230.

At S238, P1 is computed as the phase of F1. The phase P1 may be used for the current iteration of the process in FIG. 2, and may be replaced each time S238 is repeated in each later iteration.

At S242, the denoised high-frequency band waveform y1H is computed using an inverse Fourier transform based on the average magnitude spectrum AMSd from S234 and the phase P1 from S238. The phase P1 used in the inverse Fourier transform may be the phase from the current iteration, whereas the magnitude is the averaged magnitude spectrum from all iterations.

At S246, a determination is made whether iterations for the current process of FIG. 2 are complete. If iterations are not complete (S246=No), at S250 y1 is set to y1L and y2 is set to y2L and the process returns to S218. That is, for a second iteration and subsequent iterations, the previous voltage low-band waveforms are set at S250 as the voltage waveform to be split next at S218, and then the process returns to S218 to split the reset voltage waveforms into a new y1L and y1H to repeat the process. An example of repeated splitting of spectrums in iterations is shown in and explained with respect to FIG. 6 below. As examples, the method of FIG. 2 may be performed for one iteration, for two iterations, or for three iterations before proceeding to S254.

If iterations for the current acquisition are complete (S246=Yes), at S254 the denoised waveform is computed using the lowest-frequency band waveform y1L from the last iteration and all denoised high-frequency band waveforms y1H from each instance of S242 in the iterations. That is, computations of denoised y1H from the first iteration, the second iteration, the third iteration and so on may be accumulated. In some embodiments, the process is repeated for three iterations, so that if the spectrum is split 50/50, the highest frequency band y1H contributions to the denoised waveform at S254 will cover 87.5% or so of the original spectrum of the first radio frequency signal. The denoised waveform is computed from low-frequency band waveform y1L and denoised high-frequency band waveforms y1H using a suitable, orthogonal, inverse sub-band processing method, such as an inverse wavelet transform.

At S258, a determination is made whether acquisitions are complete, and if acquisitions are complete (S258=Yes), post processing oscilloscope analysis is performed at S262. In other words, the system 100 may be an oscilloscope, and the method of FIG. 2 through S258 may be performed as pre-processing for other oscilloscope functions, such as other oscilloscope functions requested by a user using the user interface 181 in FIG. 1B. While the resultant measured waveform may be described as being denoised, the noise removed is the noise of the measurement system and not the noise of the DUT 10. Denoised waveforms may be plotted or used as input to an analysis algorithm, including jitter trends and histograms, eye diagrams, crosstalk analysis, power fidelity or any other analysis package. If acquisitions are not complete (S258=No), the processing in FIG. 2 returns to S214.

According to the present teachings herein, the frequency spectrum of y1 and y2 may be divided into different bands so that a cross-correlation algorithm may be performed separately on each of the high-frequency bands of y1 and y2 while excluding or ignoring the lowest frequency band. As a reminder, the low-frequency components are the primary contributors to problems in the reconstructed waveform, and so the method of FIG. 2 provides a way to avoid such problems.

By way of explanation, windowing corrupts noise to be measured. In spectral algorithms, the magnitude and phase of the spectrum may be separated. Multiple data acquisitions may be combined to create an average magnitude spectrum, which is improved as new data are added. Because the magnitude spectrum is averaged with more data, but the phase spectrum is not, the window function can affect the signal and the noise differently and this may corrupt the noise in unpredictable ways. For example, in the reconstructed waveform, the noise magnitude may vary with time, rather than being constant. The splitting at S218 in FIG. 2 and similar splitting in other methods described herein enhances the usability of the algorithm by applying the noise reduction to high-frequency bands and not to the lowest-frequency bands, as this avoids the corruption of noise at the low-frequency end of the original spectrum.

Figure 3:
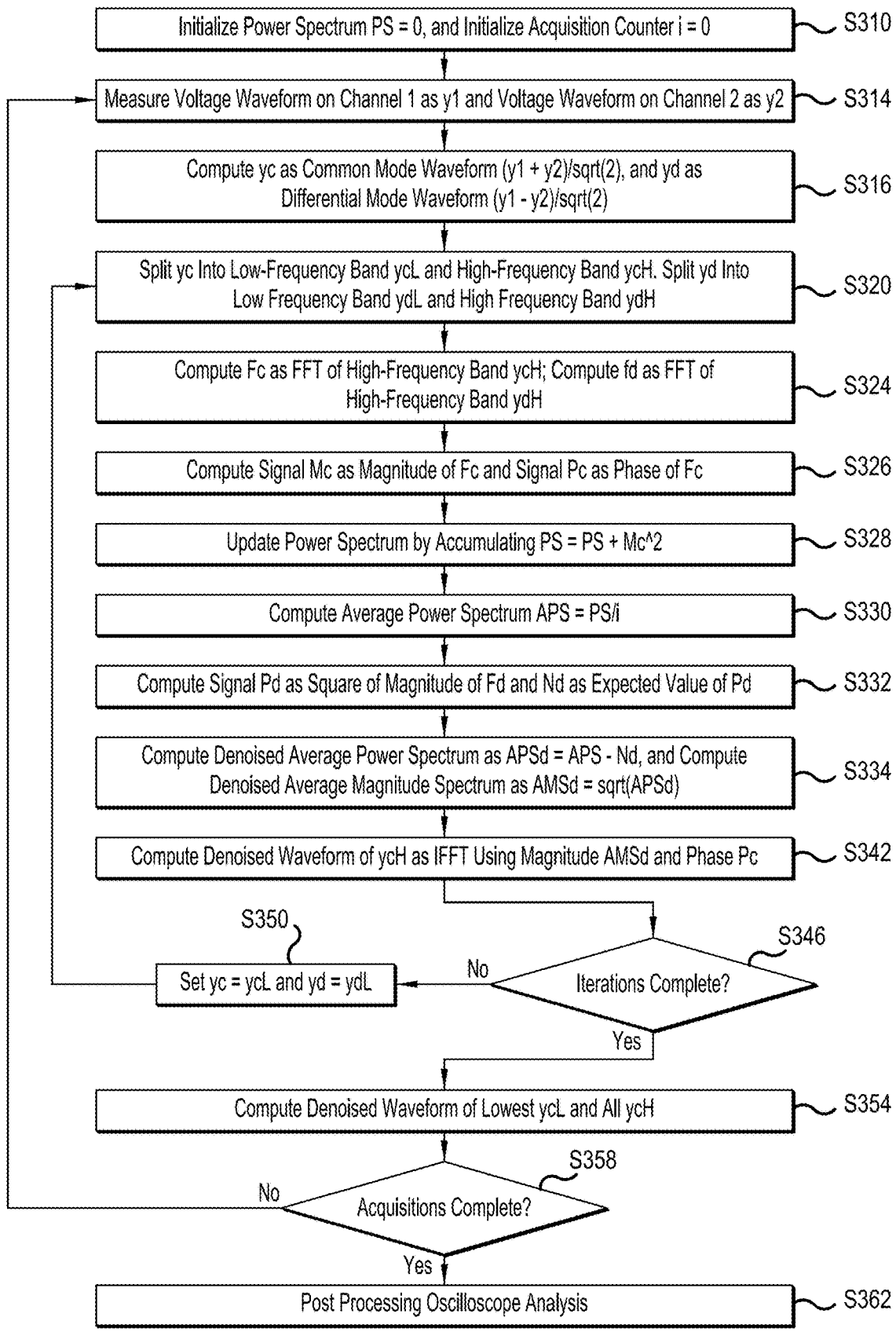
FIG. 3 illustrates a method for improved noise reduction of oscilloscope waveforms, in accordance with a representative embodiment.

FIG. 3 illustrates a method for improved noise reduction of oscilloscope waveforms, in accordance with a representative embodiment.

The method of FIG. 3 may be performed by the system 100 in FIG. 1A. The method of FIG. 3 starts at S310 when a power spectrum PS is initialized to 0, and an acquisition counter i is initialized to 0. The power spectrum PS may be initialized to 0 by the system 100 clearing a section of the memory 140 that will be used to store voltage waveform measurements from the first radio frequency signal and the second radio frequency signal from the DUT 10. For example, a section of flash memory may be erased as part of the initialization of the power spectrum PS to 0. The acquisition counter i may be initialized to 0 by clearing a section of the memory 140 that will be used to count acquisitions by the system 100. For example, a register in DRAM may be cleared to set the acquisition counter to 0.

At S314, a voltage waveform is measured on channel 1 as y1 and a voltage waveform is measured on channel 2 as y2. The measured voltage waveform y1 may be a waveform of a first radio frequency signal measured by the oscilloscope on channel 1 and may be equal to y+ys1 where y is the true waveform of the first radio frequency signal from the DUT 10 and ys1 is the random noise generated by the sampling circuitry on channel 1 of the system 100. The measured voltage waveform y2 may be a waveform of a second radio frequency signal measured by the oscilloscope on channel 2 and may be equal to y+ys2 where y is again the true waveform of the second radio frequency signal from the DUT 10 and ys2 is the random noise generated by the sampling circuitry on channel 2 of the system 100. For example, the probe 102 may receive the radio frequency signal from the output 11 of the DUT 10 and provide the radio frequency signal to the first sampler 120 and the second sampler 122 as the first signal 13 and the second signal 19 via the power splitter 17. The measured voltage waveforms may reflect the waveforms as output by the first sampler 120 and the second sampler 122.

At S316, yc is computed as the common mode waveform of (y1+y2)/sqrt(2), and yd is computed as the differential mode waveform (y1−y2)/sqrt(2), where sqrt ( ) is the square root function. That is, at S316 a common mode waveform yc and a differential mode waveform yd are computed based on y1 and y2 as measured at S314. The term sqrt(2) is a scaling factor that gives the power spectrum below the right magnitude. Other scaling terms may be used now, or later, so long as comparative spectra are normalized to the same level.

At S320, yc is split into the low-frequency band waveform ycL and the high-frequency band waveform ycH. yd is split into the low-frequency band waveform ydL and the high-frequency band waveform ydH. Notably, in comparison to the embodiment of FIG. 2, in FIG. 3 the voltage waveforms which are split are the common mode waveform and the differential mode waveform rather than y1 and y2. According to a representative embodiment of the present teachings, the frequency spectrum of yc and yd may be divided into different bands so that a noise reduction algorithm may be performed separately on each of the high-frequency bands of yc and yd while excluding or ignoring the lowest frequency band. As a reminder, the low-frequency components are the primary contributors to problems in the reconstructed waveform, and so the method of FIG. 3 provides a way to avoid such problems.

By way of explanation, windowing corrupts noise to be measured. In a noise reduction algorithm, the magnitude and phase of the spectrum may be separated. Multiple data acquisitions may be combined to create an average magnitude spectrum, which is improved as new data are added. Because the magnitude spectrum is averaged with more data, but the phase spectrum is not, the window function can affect the signal and the noise differently and this may corrupt the noise in unpredictable ways. For example, in the reconstructed waveform, the noise magnitude may vary with time, rather than being constant. The splitting at S320 in FIG. 3 and similar splitting in other methods described herein enhances the usability of the noise reduction algorithm by applying the noise reduction to high-frequency bands and not to the lowest-frequency band, as this avoids the corruption of noise at the low-frequency end of the original spectrum.

Figure 7:
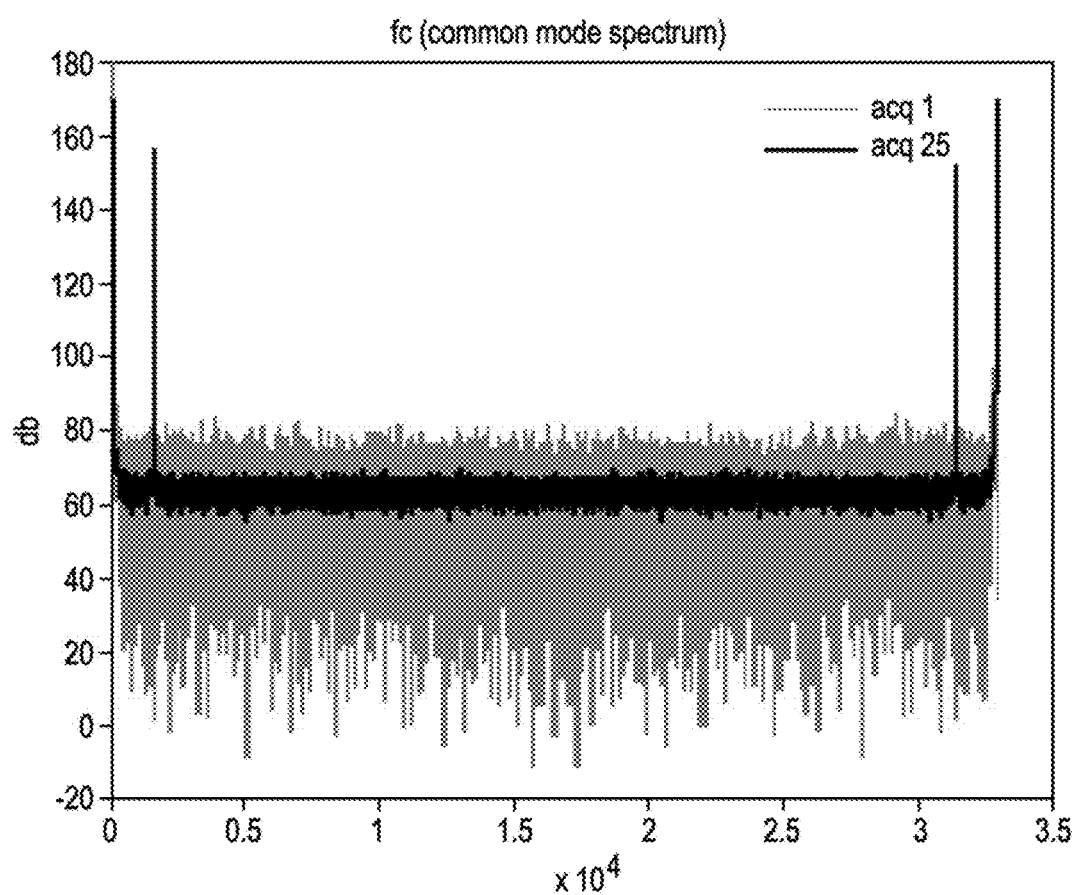
FIG. 7 illustrates comparative spectrums for a common mode signal in improved noise reduction of oscilloscope waveforms, in accordance with a representative embodiment.
Figure 8:
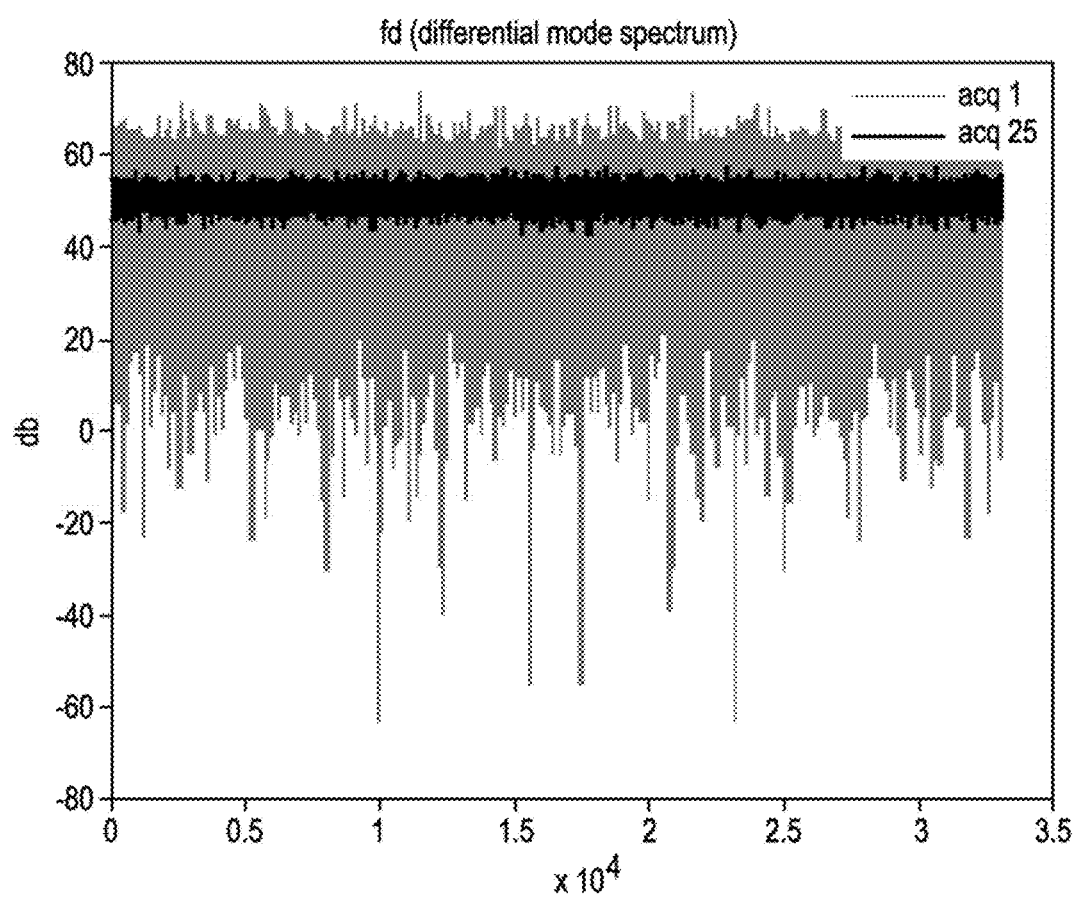
FIG. 8 illustrates comparative spectrums for a differential mode signal in improved noise reduction of oscilloscope waveforms, in accordance with a representative embodiment.

At S324, the frequency spectrum Fc is computed as a Fourier transform for the high-frequency band waveform ycH. Also at S325, the frequency spectrum Fd is computed as a Fourier transform for the high-frequency band waveform ydH. The frequency spectrum Fc may be considered a first new spectrum computed by the system 100 performing a first Fourier transform based on the measurement of y1 as the first radio frequency signal and based on the measurement of y2 as the second radio frequency signal. The frequency spectrum Fd may be considered a second new spectrum computed by the system 100 performing a second Fourier transform based on the measurement of y1 as the first radio frequency signal and based on the measurement of y2 as the second radio frequency signal. The Fourier transforms may be fast Fourier transforms (FFTs), but the teachings herein are not limited to FFTs, and other forms of Fourier transform computations may alternatively be used. The common mode signal yc contains signal components of the first radio frequency signal and the second radio frequency signal from the DUT 10, along with contributions from channel 1 and channel 2 of the system 100. The differential mode signal yd contains only signal components that are contributions of channel 1 and channel 2 of the system 100. The signal components of the radio frequency signals from the DUT 10 may contain both periodic data and random noise. The frequency spectrum Fc may be computed as the Fourier transform of yc, and the magnitude of this frequency spectrum Fc may be proportional to the frequency content of y, plus noise added by the system 100 such as noise added respectively by the first sampler 120 and the second sampler 122. The spectrum for yc is shown in FIG. 7 and explained later in the context of 1 acquisition and also in the context of 25 acquisitions. The spectrum shown in FIG. 7 includes spikes that represent the periodic components in the data of the radio frequency signal from the DUT 10. The noise "floor" in FIG. 7 is the flat portion of the spectrum for yc and represents noise from both DUT 10 and system 100. The noise spectrum becomes smoother with more acquisitions. The spectrum for yd is shown in FIG. 8.

At S326, a signal Mc is computed as the magnitude of the frequency spectrum Fc. Also at S316, the signal Pc is computed as the phase of the frequency spectrum Fc.

At S328, the power spectrum is updated by accumulating PS=PS+Mc^2. That is, the power spectrum is updated for each acquisition, so that the new power spectrum equals the previous power spectrum and the square of Mc calculated for the current iteration at S326. For the first acquisition, the power spectrum PS will be the initial power spectrum PS.

At S330, the average power spectrum APS is computed as the power spectrum divided by the current count i of the acquisition counter. For the first acquisition, the average power spectrum APS will simply be the initial power spectrum, whereas for subsequent acquisitions the average power spectrum APS will be an average of the accumulated power spectrum as calculated at 328. This method of computing an accumulated average by accumulating a sum and dividing by the count is the simplest approach, but other variations may also be used.

At S332, the combined oscilloscope noise power spectrum Pd is computed as the square of the magnitude of the frequency spectrum Fd, and the scalar Nd is computed as an expected value of Pd. The expected value Nd may be any scalar measure of the spectrum for noise, such as the mean value, a weighted mean value, or median value.

At S334, the denoised average power spectrum is computed as APSd=APS−Nd, and the denoised average magnitude spectrum is computed as AMSd is equal to the square root of APSd. Although the term "denoised" is used herein, the noise reduction achieved for embodiments herein may not be a complete reduction in noise. Instead, the noise removed from signals is the noise attributable to the system 100, as noise in signals from the output 11 of the DUT 10 should remain after the process of FIG. 3 and other processes described herein. For S334, the average spectrum may be represented as the average of magnitude spectrums from each iteration of S334.

Figure 9:
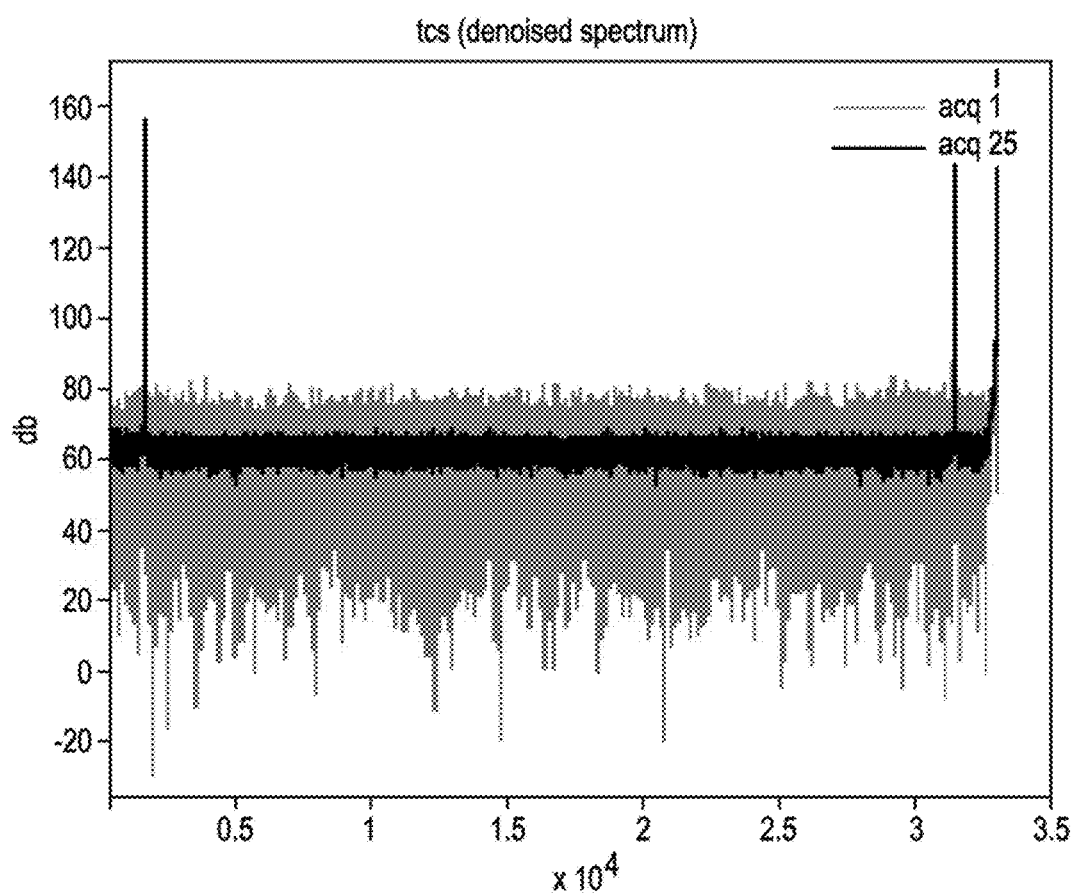
FIG. 9 illustrates a noise-reduced spectrum in improved noise reduction of oscilloscope waveforms, in accordance with a representative embodiment.

Also for S334, the combined oscilloscope noise Nd may be obtained by measuring the magnitude of the second spectrum Fd. The denoised average power spectrum APSd is computed by subtracting Nd from the average power spectrum computed at S330. In other words, a new power spectrum, APSd=APS-Nd may be formed. As shown in FIG. 9, this explicitly lowers the "noise floor" of APS, and the oscilloscope noise may be removed or at least substantially reduced from the new power spectrum APSd.

At S342, the denoised waveform of ycH is computed as an inverse Fourier transform using the magnitude AMSd and the phase signal Pc. The inverse Fourier transform may be an inverse fast Fourier transform (IFFT), but the teachings herein are not limited to IFFTs, and other forms of inverse Fourier transform computations may alternatively be used. The system 100 in FIG. 1A may be an oscilloscope and may be configured to compute a first waveform of the first new spectrum with noise of the oscilloscope reduced by performing the inverse Fourier transform as a first inverse Fourier transform based on the first new spectrum.

For S342, to recover the waveform of the first radio frequency signal from the DUT 10 back in the time domain, the phase component Pc from S326 from the most recent acquisition may be combined with the magnitude of the averaged spectrum from S334 in the inverse FFT, to return to the time domain. This reconstructs a version of the high-frequency band of the common mode waveform without corruption by noise added by the oscilloscope.

At S346, a determination is made as to whether iterations are complete. If iterations are not complete (S346=No), at S350 yc is set to ycL and yd is set to ydL and the process then returns to S320. In other words, if iterations are not complete, the voltage waveforms yc and yd for the next iteration are reset to what was ycL and ydL for the current iteration and the process returns to S320. If iterations are complete (S346=Yes), at S354 the denoised waveform of the common mode signal is computed from the lowest-frequency band waveform ycL from the last iteration and denoised high-frequency band waveforms ycHs from all iterations. The denoised waveform is illustratively computed from low-frequency band waveform ycL and denoised high-frequency band waveforms ycHs using a suitable, orthogonal, inverse sub-band processing method, such as an inverse wavelet transform.

At S358, a determination is made as to whether acquisitions are complete. If acquisitions by the system 100 are not complete (S358=No), the process returns to S314. The oscilloscope noise may be increasingly reduced as more data is added, insofar as the spectrum for voltage waveforms y1 and y2 are measured again for each new acquisition, and power spectrums for the common mode waveforms and differential mode waveforms based on y1 and y2 are averaged with magnitudes of corresponding waveforms from previous acquisitions as at S328.

If acquisitions by the system 100 are complete (S224=Yes), post processing oscilloscope analysis is performed at S362. In other words, the system 100 may be an oscilloscope, and the method of FIG. 3 through S358 may be performed as pre-processing for other oscilloscope functions, such as other oscilloscope functions requested by a user using the user interface 181 in FIG. 1B. While the resultant measured waveform may be described as being denoised, the noise removed is the noise of the measurement system and not the noise of the DUT 10. Denoised waveforms may be plotted or used as input to an analysis algorithm, including jitter trends and histograms, eye diagrams, crosstalk analysis, power fidelity or any other analysis package.

In a modification of embodiments based on FIG. 3, instead of computing the scalar Nd as an expected value of Pd at S332, a signal Nd may be computed as a filtered version of Pd. For example, the expected value may be obtained by a trend-preserving vector approximation, such as by a low pass filter, median filter, or curve fit, to filter out periodic components of Fd, and the denoised average power spectrum is again computed at S334 as APSd=APS-Nd, wherein Nd is now the signal Nd computed as a filtered version of Pd.

In an alternative embodiment to the representative embodiments described in connection with FIG. 3, instead of using the most recent noise power spectrum Pd in S332 to compute the expected value Nd, the noise power spectrum Pd in S332 may be averaged over multiple acquisitions, in a manner similar to the power spectrum PS described in connection with S328 and S330, so that for the initial acquisition the noise power spectrum is Pd, whereas for subsequent acquisitions Pd will be an average of the accumulated noise power spectrums.

In embodiments based on FIG. 3, channel data may be combined in common mode and differential mode to increase the rate of convergence of the noise reduction, or in other words, to remove noise faster. The approach of FIG. 3 may also be generalized to more than 2 channels, such as 4 channels, for even faster convergence. The method of representative embodiments described in connection with FIG. 3 also returns an estimate of the oscilloscope noise as represented by the magnitude of Nd.

In simulations and measurements, the method of FIG. 3 is shown to converge quickly because the common mode signal yc=y1+y2 is already averaging out some of the oscilloscope noise, even before beginning a cross correlation algorithm, since noise from channel 1 and channel 2 are uncorrelated.

Figure 4:
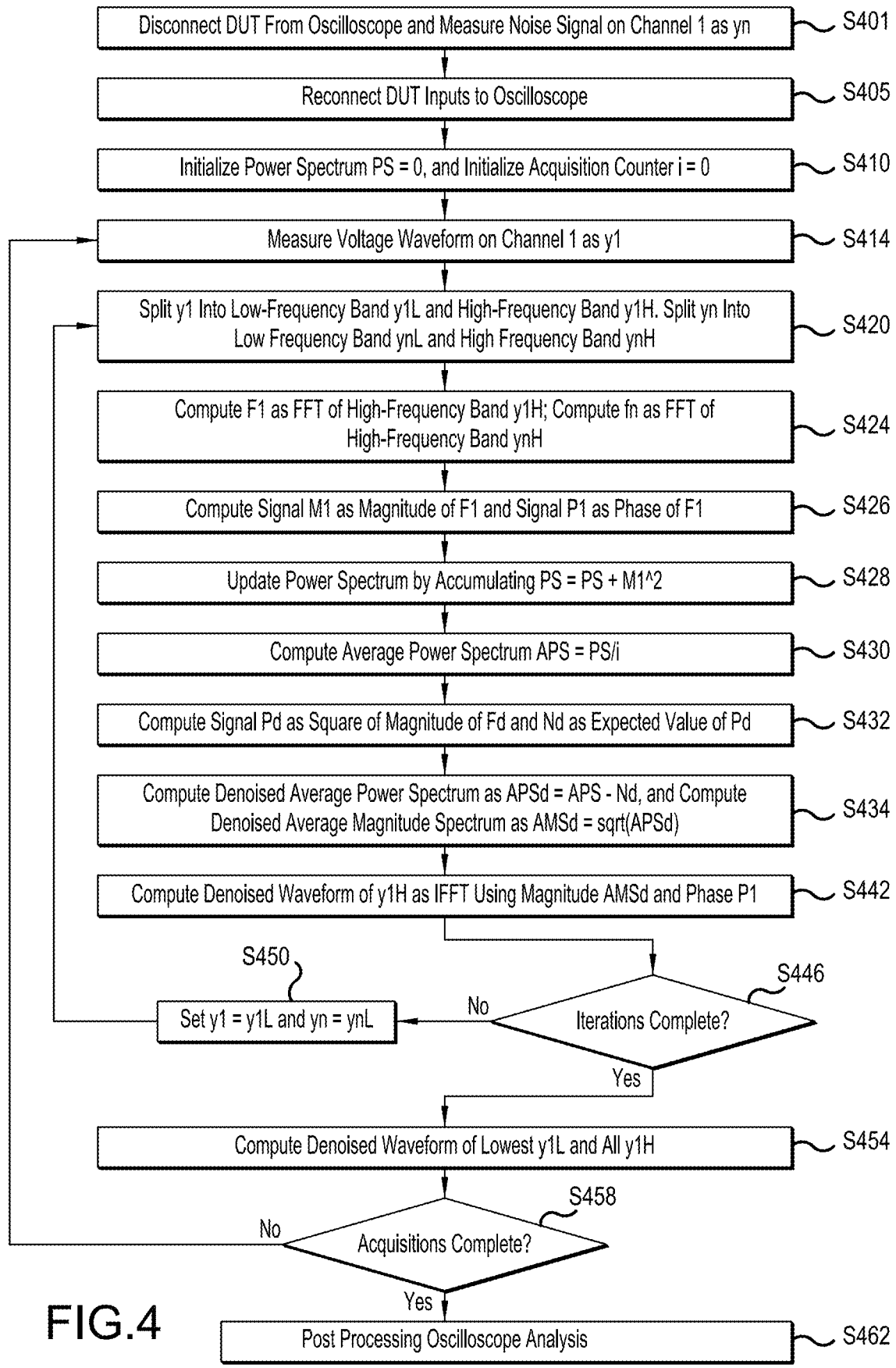
FIG. 4 illustrates a method for improved noise reduction of oscilloscope waveforms, in accordance with a representative embodiment.

FIG. 4 illustrates a method for improved noise reduction of oscilloscope waveforms, in accordance with a representative embodiment.

The method of FIG. 4 may be performed by the system 100 in FIG. 1A. At S401, a DUT is disconnected from an oscilloscope and a noise signal is measured on channel 1 as yn. For example, the system 100 in FIG. 1A may comprise an oscilloscope, and the DUT 10 may be disconnected from the oscilloscope at S401. The DUT may comprise a mobile communication device such as a smartphone, table or laptop computer.

At S405, the DUT 10 is reconnected to the inputs of the system. For example, the probe 102 in FIG. 1A may be reconnected to components of the DUT 10, though the connection may be direct or indirect. An indirect connection may occur when the probe 102 is placed in close proximity to the DUT 10 without actually touching a component of the DUT 10, such as when the output 11 is an antenna or antenna array.

At S410, the power spectrum PS is initialized to 0, and the acquisition counter i is initialized to 0. The power spectrum PS may be initialized to 0 by the system 100 clearing a memory such as a flash memory that will be used to store voltage waveform measurements from the first radio frequency signal from the DUT 10. The acquisition counter i may be initialized to 0 by clearing a memory such as a DRAM memory that will be used to count acquisitions by the system 100.

At S414, a voltage waveform on channel 1 is measured as y1. The measured voltage waveform of y1 may be for a first radio frequency signal. Notably, S412 may be performed in the absence of a channel 2 or otherwise without using a channel 2.

At S420, y1 is split into a low-frequency band waveform y1L and a high-frequency band waveform y1H. Also at S420, yn is split into a low-frequency band waveform ynL and a high-frequency band waveform ynH. According to the teachings herein, the frequency spectrum of y1 and yn may be divided into different bands so that a noise reduction algorithm may be performed separately on each of y1 and yn while excluding or ignoring the lowest frequency band. As a reminder, the low-frequency components are the primary contributors to problems in the reconstructed waveform, and so the method of FIG. 4 provides a way to avoid such problems.

At S424, the frequency spectrum F1 of the voltage waveform y1H is computed as a Fourier transform. The frequency spectrum F1 may be considered a first new spectrum computed by the system 100 performing a first Fourier transform based on the measurement of y1 as the first radio frequency signal. The frequency spectrum F1 in embodiments based on FIG. 4 may be a first new spectrum computed based on the measurement of the first radio frequency signal at S414. Also at S424, the frequency spectrum Fn of the voltage waveform ynH is computed as a Fourier transform. The frequency spectrum Fn may be considered a second new spectrum computed by the system 100 performing a second Fourier transform based on the measurement of yn at S401.

At S426, the signal M1 is computed as the magnitude of F1 and the signal P1 is computed as the phase of F1.

At S428, the power spectrum PS is updated by accumulating PS=PS+M1^2. The average power spectrum APS is simply M1 for the first acquisition, but will reflect an average of multiple acquisitions after the first acquisition and after the first iteration of the method of FIG. 3A.

At S430, the acquisition counter i is updated to i+1, and the average power spectrum APS is computed as the power spectrum PS from S428 divided by the current count i of the acquisition counter. This method of computing an accumulated average by accumulating a sum and dividing by the count is the simplest approach, but other variations may also be used.

At S432, the oscilloscope noise power spectrum Pd is computed as the square of the magnitude of Fn, and the scalar Nd is computed as the expected value of Pd.

At S434, the denoised average power spectrum APSd is computed as APSd=APS-Nd, and the denoised average magnitude spectrum is computed as AMSd=to the square root of APSd. That is, the scalar Nd which was computed at S432 using yn as the estimated contribution of the oscilloscope noise to the first radio frequency signal is removed from the average power spectrum APS computed at S434.

As a reminder, although the term "denoised" is used herein, the noise reduction achieved for embodiments herein may not always be a complete reduction in noise. Instead, the noise removed from signals is the noise attributable to the system 100, as noise in signals from the DUT 10 should remain after the process of FIG. 4 and other processes described herein.

At S442, the denoised high-frequency band waveform y1H is computed as an inverse Fourier transform using the magnitude AMSd and the phase of P1. The denoised waveform computed at S442 may be a first waveform with noise of the oscilloscope reduced by performing the first inverse Fourier transform based on the first new spectrum computed at S424 and the estimated contribution of the oscilloscope noise Nd to the first radio frequency signal subtracted at S434.

For S442, to recover the high-frequency band waveform of the first radio frequency signal from the DUT 10 back in the time domain, the phase component from the most recent acquisition may be combined with the magnitude of the averaged spectrum in the inverse Fourier transform, to return to the time domain. The denoised high-frequency band waveform y1H may be computed as the inverse Fourier transform using the magnitude of AMSd over all iterations and the phase P1 from the current iteration. This reconstructs a version of the high-frequency band waveform of the first radio frequency signal from the DUT 10 without noise from the oscilloscope.

At S446, a determination is made as to whether iterations are complete. If iterations are not complete (S446=No), at S450 waveform y1 is set to y1L from the current iteration and noise waveform yn is set to ynL from the current iteration, and the process returns to S420. If the iterations are complete, at S454, the resultant denoised waveform y1 is computed using the lowest-frequency band waveform y1L from the most recent split at S420 and the combination of all y1H waveforms from all iterations. The resultant denoised waveform is computed from low-frequency band waveform y1L and denoised high-frequency band waveforms y1H using a suitable, orthogonal, inverse sub-band processing method, such as an inverse wavelet transform.

At S458, a determination is made as to whether acquisitions are complete. If acquisitions by the system 100 are not complete (S458=No), the process returns to S414. The oscilloscope noise may be increasingly reduced as more data is added, insofar as the power spectrum PS is computed on each new acquisition and then averaged with power spectra from previous acquisitions.

If acquisitions by the system 100 are complete (S458=Yes), post processing oscilloscope analysis is performed at S462. Again, while the resultant measured waveform may be described as being denoised, the noise removed is the noise of the measurement system and not the noise of the DUT 10. Denoised waveforms may be plotted or used as input to an analysis algorithm, including jitter trends and histograms, eye diagrams, crosstalk analysis, power fidelity or any other analysis package.

In some embodiments based on a modification to FIG. 4, instead of computing the scalar Nd as an expected value of the noise power Pd of the oscilloscope at S432 as in FIG. 4, the signal Nd may be computed as a filtered version of the noise power Pd of the oscilloscope. For example, the expected value may be obtained by a trend-preserving vector approximation, such as by a low pass filter, median filter, or curve fit to filter out periodic components of Pd.

In some embodiments based on a modification to FIG. 4, instead of computing the noise estimates on each acquisition, they may be computed once and re-used on subsequent acquisitions, since they do not change on subsequent acquisitions. That is, the low-frequency band waveform ynL and the several iterations of the high-frequency band noise waveforms ynH, along with power spectra Pd and noise estimates Nd, need only be computed one time, after each noise calibration step S401.

In embodiments based on FIG. 4, the signal from the DUT 10 is not split onto two separate oscilloscope channels during the active testing process. Instead, only one channel is required, which matches a workflow-frequently used for oscilloscopes, and which may sometimes be the only option. That is, in embodiments based on FIG. 4, the incoming signal does not have to be split into two channels. Instead, only the spectrum F1 is computed, where F1 is the Fourier transform of y1, and the waveform yn is acquired before the iterated process which begins at S414. Multiple acquisitions are taken to obtain a progressively improved estimation of the power spectrum, and a constant proportional to the noise of the oscilloscope is again subtracted. The reduced spectrum APSd=APS-Nd may be computed, where Nd is an estimate of the scope noise on channel 1. An advantage to using embodiments based on FIG. 4 is relative simplicity in that the signal does not have to be split into two separate paths and this avoids disruptions which can otherwise introduce errors due to cables not being completely matched, and due to non-ideal connectors. However, an advantage to using embodiments based on FIG. 2 and FIG. 3 is that in FIG. 4 the noise magnitude on channel 1 may be estimated, and this requires the calibration step S401. While calibration is currently an accepted practice, it may be avoided by using embodiments based on FIG. 2 and FIG. 3.

Before proceeding, a more detailed discussion of how to split the waveform into low-frequency and high-frequency bands is in order. A straightforward way to split the waveform is to compute the spectrum and simply draw a dividing line in the spectrum so as to use a "brick wall" filter. A "brick wall" filter is convenient in the frequency domain, but a brick wall filter in the time domain is very long such that resulting distortions are long-lived in the time domain once the denoised waveform is reconstructed. Gentle filters such as simple low-pass and high-pass filters may be used to split the waveform into low- and high-frequency bands, but these bands cannot be re-combined later such as in S254, S354 and S454, because these filters are not usually reversible. In other words, "long-lived distortions" are simply moved from the time domain to the frequency domain because low-pass and high-pass filters mix information from the bands, rather than cleanly separate them. As one way to trade off the distortion created by filtering, a wavelet transform may be used. Wavelet transforms divide a signal into low-frequency and high-frequency bands using low order filters. Wavelet transforms use low order filters in the time domain, which do not create long-lived distortions in the frequency domain, and yet are also fully reversible such that the low-frequency and high-frequency bands may be recombined without any loss of information or distortion. When wavelet filtering is to be used, the wavelet filtering involves splitting the first channel waveform y1 into low-frequency and high-frequency waveforms, y1L and y1H, and splitting the second channel waveform y2 into y2L and y2H before performing the noise reduction algorithms according to the illustrative methods described above but only using the high-frequency waveforms y1H and y2H. The reconstruction at S254, S354 and S454 is possible because wavelets are reversible.

FIG. 5 illustrates a split power spectrum for improved noise reduction of oscilloscope waveforms, in accordance with a representative embodiment.

As described herein, instead of accumulating the full spectrum F, the spectrum F is split into low-frequency and high-frequency bands, and only the data in the high-frequency band is accumulated and subjected to noise reduction to reduce oscilloscope noise. In other words, the low-frequency content is ignored insofar as the low-frequency content is the source of problems to be avoided. In FIG. 5, the spectrum F is written as F=Fl (low-frequency band)+Fh (high-frequency bands).

Figure 6:
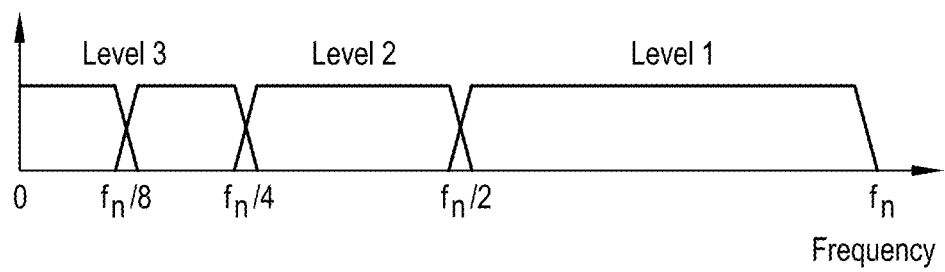
FIG. 6 illustrates a progression of splits of a power spectrum for improved noise reduction of oscilloscope waveforms, in accordance with a representative embodiment.

FIG. 6 illustrates a progression of splits of a power spectrum for improved noise reduction of oscilloscope waveforms, in accordance with a representative embodiment.

If the power spectrum was only divided into two equal parts in only one iteration, the noise-reduction algorithms described herein would only remove the noise from one-half of the power spectrum. Iterations to repeatedly split the power spectrum initially, and then each low-frequency portion of the power spectrum subsequently, allow the system 100 in FIG. 1 to reduce oscilloscope noise from more of the power spectrum. The alternative would be to try including low-frequency components and triggering Gibb's phenomenon. Wavelets provide a natural way to control how much of the spectrum is used in the noise reduction algorithm. Wavelet decompositions typically work by first dividing the signal into low-frequency and high-frequency band signals, of equal size, and then using an iterative process to subdivide the low-frequency band signals one or more additional times. For example, after the first split, wavelet decomposition takes the low-frequency band signal and divides the low-frequency band signal into two new low-frequency and high-frequency band signals. The new low-frequency band signal is now only one-fourth the size of the original signal. The resultant low-frequency band signal is fed into the next round, and again split in half to produce a new low-frequency band signal which is one-eighth the size of the original signal, and so on. FIG. 6 represents how the spectrum is divided repeatedly.

In the methods of FIG. 2, FIG. 3 and FIG. 4, the noise reduction algorithm is applied separately on each band in FIG. 6 except for the lowest. By controlling how many levels of wavelet decomposition to perform, the size of the lowest frequency band is controlled. If the resultant low-frequency band is made too small, then more low-frequency information is included in the algorithm, which runs the risk of triggering Gibb's phenomenon. In some embodiments, 4 iterations may be used as a compromise for reducing oscilloscope noise while also avoiding Gibb's phenomenon.

To generalize further, wavelets are part of a larger family of algorithms sometimes referred to as "multiresolution analysis," or "sub-band processing," and any of these decompositions may be made to work so long as the decompositions are reversible. As an example for wavelets, Haar wavelets may be used insofar as Haar wavelets are relatively simple and thus fast to compute.

FIG. 7 illustrates comparative spectrums for a common mode signal in improved noise reduction of oscilloscope waveforms, in accordance with a representative embodiment.

FIG. 7 shows an example of the spectrum for yc, after 1 acquisition, and again after 25 acquisitions, such as when the method of FIG. 3 is repeated 25 times. This is also illustrative of the spectrum for y1 in the method of FIG. 4. The spikes shown in FIG. 7 represent periodic components in the data of the radio frequency signals from the DUT 10. The noise "floor", the flat portion of the spectrum for yc, represents noise from both DUT and oscilloscope. For Gaussian noise, the noise will have a constant value across all frequencies. However, oscilloscope processing, such as waveform filtering and interpolation may change the shape of the noise floor. The noise spectrum becomes smoother with more acquisitions.

FIG. 8 illustrates comparative spectrums for a differential mode signal in improved noise reduction of oscilloscope waveforms, in accordance with a representative embodiment.

FIG. 8 shows an example of the spectrum for yd=ys1−ys2 in the method of FIG. 3. The differential mode signal yd only contains noise contributions from the oscilloscope and Fd is the Fourier transform of yd. The magnitude of Fd is proportional only to combined oscilloscope noise, Nd. FIG. 8 shows an example of the spectrum Fd for yd after 1 acquisition, and again after 25 acquisitions, such as if the method of FIG. 3 is repeated 25 times, and where Fd is computed as the average spectrum from all previous acquisitions.

FIG. 9 illustrates a noise-reduced spectrum in improved noise reduction of oscilloscope waveforms, in accordance with a representative embodiment.

FIG. 9 shows the noise-reduced spectrum after removing the oscilloscope noise Nd by simply subtracting Nd from the first spectrum, Fc, using the illustrative methods described in connection with FIG. 3 or FIG. 4. In other words, in FIG. 9 a new spectrum, Fcs=Fc−Nd is formed using the illustrative methods described in connection with FIG. 3 or FIG. 4, and the new spectrum explicitly lowers the "noise floor" of Fc, and the new spectrum Fcs no longer has oscilloscope noise. FIG. 9 is also illustrative of the cross-correlation spectrum X1 in the method of FIG. 2. In the representative embodiments described in connection with FIG. 2, FIG. 3 and FIG. 4, the magnitude of the spectrum Fcs is combined with the phase P1, and the inverse Fourier transform is computed on this combination to obtain a noise-reduced waveform. The spectra are averaged for each acquisition but the phase is of the most recent acquisition. The noise floor in FIG. 9 may not be smooth at first but the noise floor becomes smoother as more acquisitions are performed.

Additionally, in the methods of representative embodiments described in connection with FIG. 3. and FIG. 4, the power spectra Pd may not be a constant, even after acquiring more data, because the oscilloscope noise power may not be the same at all frequencies. Beneficially, oscilloscope noise power may be stronger in some frequency bands than in others. Also, the spectrum may not be flat due to oscilloscope pre-processing such as filtering or interpolation. These natural variations influence the trend, or slowly vary part of the spectrum. In a variation of the methods of FIG. 3 and FIG. 4, these terms are preserved by computing the new spectrum as APSd=APS-Pd, or in other words, by subtracting off the whole power spectrum Pd, rather than its estimated scalar magnitude, Nd. However, the power spectrum Pd may contain some frequency content from DUT 10 if channel 1 and channel 2 are not perfectly aligned and the signal y from the DUT 10 will not be perfectly cancelled in the subtraction y1−y2. In other words, yd, and hence Pd, may contain DUT frequency components, such as spikes due to periodic components in the data. One way to preserve the trend, or natural noise variation with frequency, while at the same time ignoring periodic terms, is to filter the spectrum Pd. Filtering may be performed by a variety of methods. In one approach, a moving, median filter is applied to Pd, to filter out periodic components, while preserving the trend. To summarize, in a basic method, the new spectrum APSd=APS-Nd is computed, where Nd is determined as the constant magnitude of power spectrum Pd. In a variation, the new power spectrum APSd=APS−Pd is formed, or in other words, the two power spectra are subtracted directly. In another variation, the new power spectrum APSd=APS-g (Pd), where g is an operator, such as a filter, wherein g may be a median filter or the like.

Figure 10:
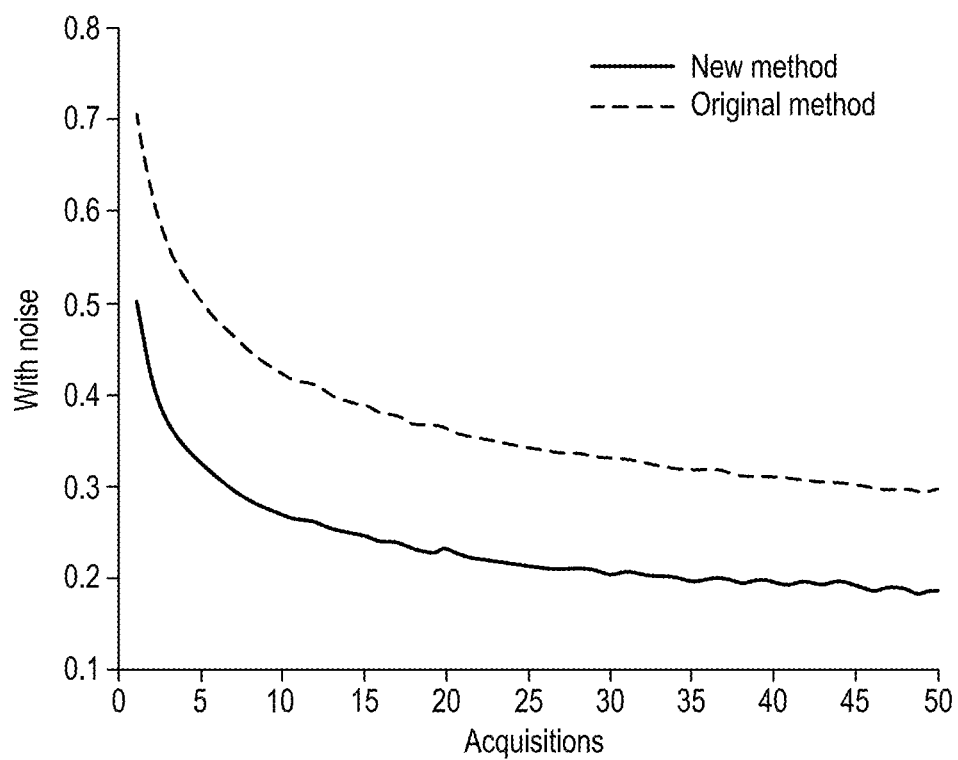
FIG. 10 illustrates comparative noise-reduced spectrums in improved noise reduction of oscilloscope waveforms, in accordance with a representative embodiment.

FIG. 10 illustrates comparative noise-reduced spectrums in improved noise reduction of oscilloscope waveforms, in accordance with a representative embodiment.

FIG. 10 shows convergence for a worst-case scenario: when the noise of the oscilloscope is 1, and the noise of the radio frequency signal from the DUT 10 is zero.

Because only oscilloscope noise is present in the worst-case scenario of zero DUT noise, illustrative method according to the algorithm attempts to remove all the noise, which is difficult. However, as shown in FIG. 10, the method of FIG. 3 converges to 0 more quickly compared to the methods of FIG. 2 and FIG. 4, as data is acquired. An advantage reflected in FIG. 10 is that the method of FIG. 3. can be extended to more channels. In a 4 channel system, for example, yc=(y1+y2+y3+y4)/2 may be computed, which improves performance due to averaging out the oscilloscope noise. The difference signal in this case, is not as well-defined, but one approach is to compute yd=(y1−y2)/2+(y3−y4)/2, which is an average of differences. This approach will converge faster than the two channel approach, at the expense of increased complexity.

Figure 11:
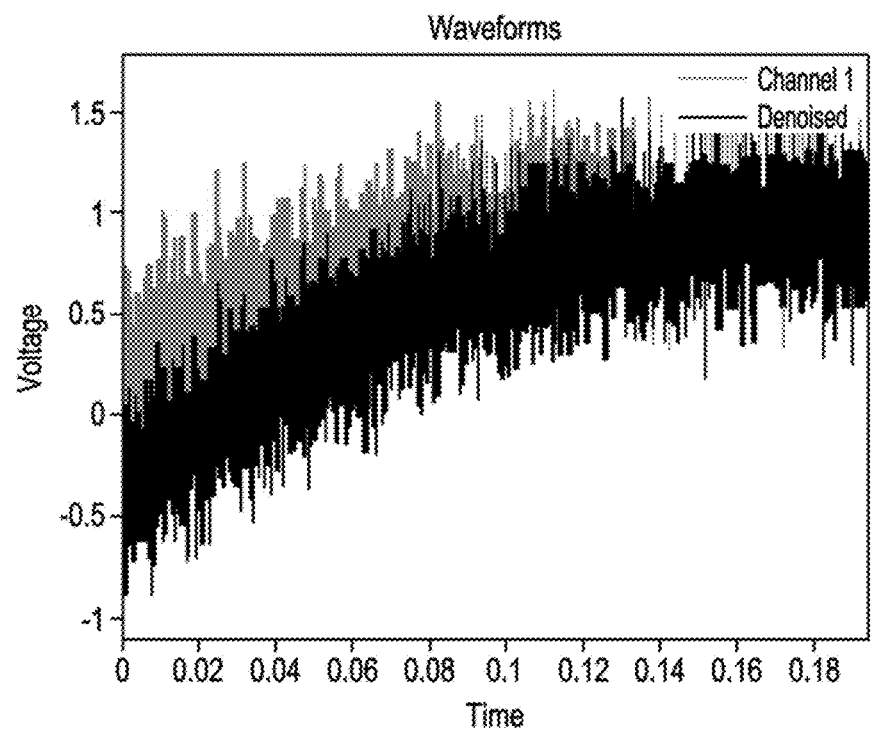
FIG. 11 illustrates distortion at the edges of a waveform as addressed by improved noise reduction of oscilloscope waveforms, in accordance with a representative embodiment.

FIG. 11 illustrates distortion at the edges of a waveform as addressed by improved noise reduction of oscilloscope waveforms, in accordance with a representative embodiment.

In FIG. 11, the denoised waveform is the result of using a noise reduction algorithm without removing the low-frequency component. The input waveform has a low-frequency component, and after running the algorithm to remove noise, without removing the low frequency band as described in FIG. 2, FIG. 3, or FIG. 4, the output waveform is shifted, or distorted compared to the original. FIG. 11 is zoomed into the left-hand side of the waveform, to show that the distortion typically happens at the edges. Windowing cannot be used to reduce this distortion. For one, after returning to the time domain, the windowing should be reversed in order to restore the shape of the original waveform. In other words, the window function may be applied as a denominator. Since most window functions taper to zero at edges, this involves dividing by zero, or numbers which are nearly zero, which is an ill-posed problem and creates distortion at the edges similar to Gibb's phenomenon. Also, the power spectrum is averaged over multiple acquisitions, while the phase is taken from the most recent iteration, which can create mismatches between the two when windowing.

Figure 12:
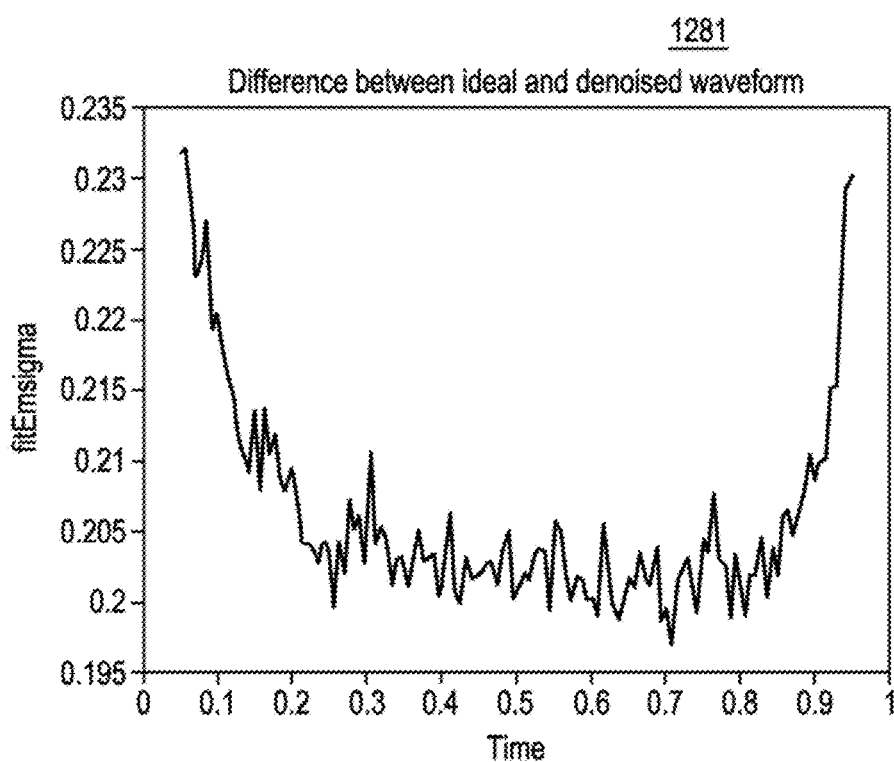
FIG. 12 illustrates waveform error due to relative distortion at the edges of a waveform as addressed by improved noise reduction of oscilloscope waveforms, in accordance with a representative embodiment.

FIG. 12 illustrates relative error in the denoised waveform due to distortion at the edges of a waveform after running the algorithm to remove noise, without removing the low frequency components, but where windowing was applied before computing the Fourier transforms.

The example in FIG. 12 involves applying a Tukey window function to a waveform before computing the FFT. FIG. 12 shows the difference between the denoised waveform and an ideal waveform with no noise. The difference should be a constant value equal to the DUT noise, which in this case is 0.2. As shown in FIG. 12, there is distortion all across the waveform, especially at the edges, as seen in the higher difference values.

Figure 13:
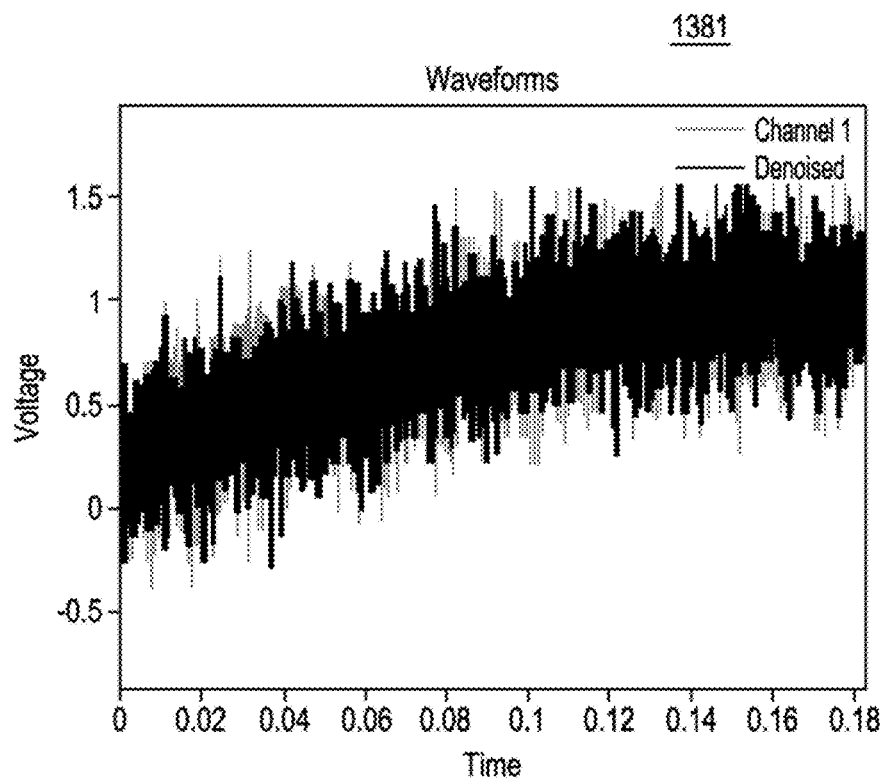
FIG. 13 illustrates improvement at the edges of a waveform in improved noise reduction of oscilloscope waveforms, in accordance with a representative embodiment.
Figure 14:
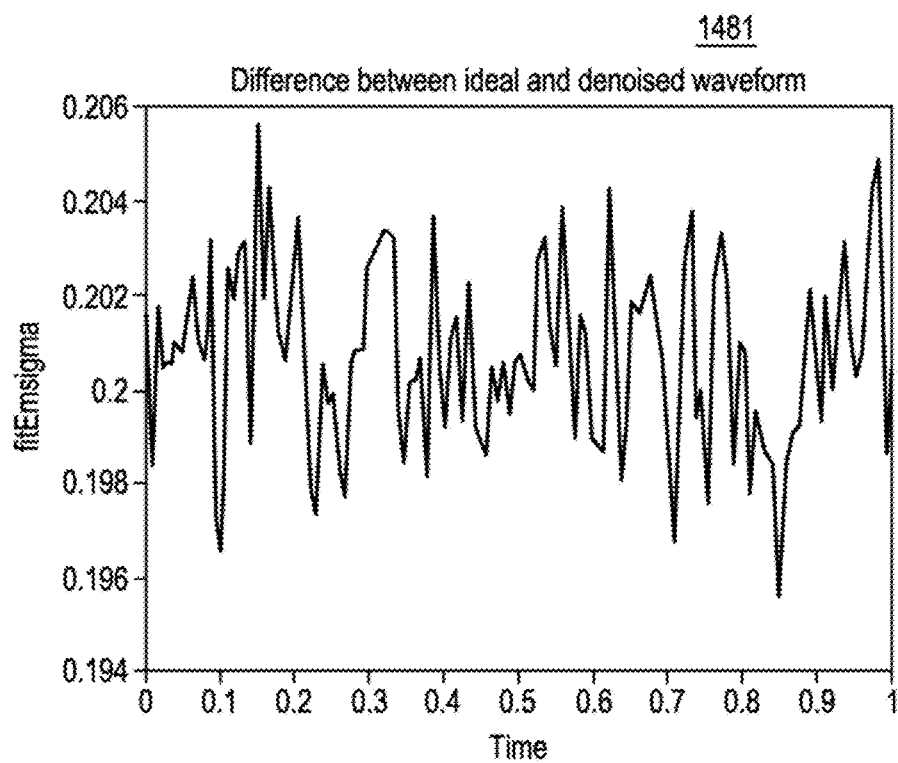
FIG. 14 illustrates improved waveform error due to relative distortion at the edges of a waveform in improved noise reduction of oscilloscope waveforms, in accordance with a representative embodiment.

FIG. 13 illustrates improvement at the edges of a waveform in improved noise reduction of oscilloscope waveforms, in accordance with a representative embodiment. FIG. 14 illustrates improved relative distortion at the edges of a waveform in improved noise reduction of oscilloscope waveforms, in accordance with a representative embodiment.

FIG. 13 and FIG. 14 show the same plots as in FIG. 11 and FIG. 12, but now using the methods of FIG. 2, FIG. 3 or FIG. 4. The distortion at the edges is eliminated. The reconstructed waveform matches the shape of the original waveform. The difference between the output waveform and an ideal waveform with no noise matches the expected DUT noise, all across the waveform (note the small range of the y-axis, and again that the correct value for this example is 0.2).

Accordingly, improved noise reduction of oscilloscope waveforms enables removal of oscilloscope noise from a measured waveform from a DUT, while still leaving the DUT noise which is the target of the measurement by the oscilloscope. As a result, the noise floor of the oscilloscope may be effectively lowered through software and accuracy of oscilloscope measurements may be improved.

As described herein, oscilloscope noise may be removed from a measured waveform from a device under test (DUT), while still leaving the noise in the radio frequency signal from the DUT 10 which is the target of the measurement by the oscilloscope. Results of removing the oscilloscope noise include effectively lowering the noise floor of the oscilloscope through software and improving accuracy of oscilloscope measurements.

Using the teachings herein, an algorithm may reduce or eliminate the influence of Gibb's phenomenon such that a noise reduction algorithm is enabled. In other words, the algorithm for reducing or eliminating noise of a measurement instrument may work even for aperiodic signals or in the presence of commonplace low-frequency components. As a result, the teachings herein enhance or even enable use of the noise reduction algorithm for reducing noise due to measurement instruments such as oscilloscopes. The effects may be seen by comparison of FIG. 11 and FIG. 13 and by comparison of FIG. 12 and FIG. 14.

Although improved noise reduction of oscilloscope waveforms has been described with reference to several exemplary embodiments, it is understood that the words that have been used are words of description and illustration, rather than words of limitation. Changes may be made within the purview of the appended claims, as presently stated and as amended, without departing from the scope and spirit of improved noise reduction of oscilloscope waveforms in its aspects. Although improved noise reduction of oscilloscope waveforms has been described with reference to particular means, materials and embodiments, improved noise reduction of oscilloscope waveforms is not intended to be limited to the particulars disclosed; rather improved noise reduction of oscilloscope waveforms extends to all functionally equivalent structures, methods, and uses such as are within the scope of the appended claims.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72 (b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

I claim:

1. An oscilloscope, comprising:
    a memory that stores instructions; and
    a processor that executes the instructions, wherein, when executed by the processor, the instructions cause the oscilloscope to:
    obtain a measurement of a first radio frequency signal;
    split a first spectrum based on the first radio frequency signal into a first low-frequency band and a first high-frequency band;
    perform a first Fourier transform to compute a first new spectrum based on the first spectrum;
    compute a first waveform of the first new spectrum with noise of the oscilloscope reduced by performing a first inverse Fourier transform based on the first new spectrum; and
    combine the first new spectrum with noise of the oscilloscope reduced with the first low-frequency band.

2. The oscilloscope of claim 1, wherein, when executed by the processor, the instructions further cause the oscilloscope to:
    obtain a measurement of a second radio frequency signal;
    split a second spectrum based on the first radio frequency signal and the second radio frequency signal into a second low-frequency band and a second high-frequency band, wherein the first spectrum is based on the first radio frequency signal and the second radio frequency signal;
    perform the first Fourier transform to compute the first new spectrum based on the measurement of the first radio frequency signal and the measurement of the second radio frequency signal, wherein the first new spectrum is of a first common mode signal based on the first radio frequency signal and the second radio frequency signal; and
    measure a contribution of the oscilloscope to noise of the first common mode signal by performing a second Fourier transform of a differential mode signal based on the first radio frequency signal and the second radio frequency signal.

3. The oscilloscope of claim 2, wherein, when executed by the processor, the instructions further cause the oscilloscope to:
  combine a magnitude of the first new spectrum of the first common mode signal and a phase of the first spectrum; and
  compute the first waveform of the first new spectrum with noise of the oscilloscope reduced by performing the first inverse Fourier transform based on the magnitude of the first new spectrum with noise of the oscilloscope reduced and the phase of the first spectrum.

4. The oscilloscope of claim 3, wherein, when executed by the processor, the instructions further cause the oscilloscope to:
  obtain a measurement of a third radio frequency signal and a measurement of a fourth radio frequency signal;
  split a third spectrum based on the third radio frequency signal and the fourth radio frequency signal into a third low-frequency band and a third high-frequency band;
  split a fourth spectrum based on the third radio frequency signal and the fourth radio frequency signal into a fourth low-frequency band and a fourth high-frequency band;
  perform a third Fourier transform to compute a second new spectrum based on the measurement of the third radio frequency signal and the measurement of the fourth radio frequency signal, wherein the second new spectrum is of second common mode signal based on the third radio frequency signal and the fourth radio frequency signal;
  measure a contribution of the oscilloscope to noise of the second common mode signal by performing a fourth Fourier transform of a differential mode signal based on the third radio frequency signal and the fourth radio frequency signal;
  combine a magnitude of the second new spectrum of the second common mode signal and a phase of the third spectrum; and
  compute a second waveform of the second new spectrum with noise of the oscilloscope reduced by performing a second inverse Fourier transform based on the magnitude of the second new spectrum of the second common mode signal and the phase of the third spectrum.

5. The oscilloscope of claim 4, wherein, when executed by the processor, the instructions further cause the oscilloscope to:
  average the first new spectrum and the second new spectrum.

6. The oscilloscope of claim 1, wherein, when executed by the processor, the instructions further cause the oscilloscope to:
  estimate a contribution of the oscilloscope to noise of the first radio frequency signal based on the first radio frequency signal; and
  perform the first Fourier transform to compute the first new spectrum based on the measurement of the first radio frequency signal; and
  perform a second Fourier transform to compute a second new spectrum based on the estimated contribution of the oscilloscope to noise of the first radio frequency signal.

7. The oscilloscope of claim 6, wherein, when executed by the processor, the instructions further cause the oscilloscope to:
  combine a magnitude of the first new spectrum and a phase of the first new spectrum; and
  compute the first waveform of the first new spectrum with noise of the oscilloscope reduced by performing the first inverse Fourier transform based on the magnitude of the first new spectrum and the phase of the first new spectrum.

8. The oscilloscope of claim 7, wherein, when executed by the processor, the instructions further cause the oscilloscope to:
  obtain a measurement of a second radio frequency signal;
  split a second spectrum based on the of the second radio frequency signal into a second low-frequency band and a second high-frequency band;
  perform a third Fourier transform to compute a third new spectrum based on the second spectrum;
  estimate a contribution of the oscilloscope to noise of the second radio frequency signal based on the second radio frequency signal;
  perform the third Fourier transform to compute the third new spectrum based on the measurement of the second radio frequency signal;
  perform a fourth Fourier transform to compute a fourth new spectrum based on the estimated contribution of the oscilloscope to noise of the second radio frequency signal
  combine a magnitude of the third new spectrum and a phase of the third new spectrum; and
  compute a second waveform of the third new spectrum with noise of the oscilloscope reduced by performing a second inverse Fourier transform based on the magnitude of the third new spectrum and the phase of the third new spectrum.

9. The oscilloscope of claim 8, wherein, when executed by the processor, the instructions further cause the oscilloscope to:
  average the first new spectrum and the third new spectrum.

10. The oscilloscope of claim 1, wherein, when executed by the processor, the instructions further cause the oscilloscope to:
  filter a noise spectrum of the oscilloscope before computing the first new spectrum.

11. The oscilloscope of claim 1, further comprising:
  a user interface that provides an option to denoise the first radio frequency signal.

12. A tangible non-transitory computer-readable storage medium that stores a computer program, wherein the computer program, when executed by a processor, causes a system to:
  obtain a measurement of a first radio frequency signal;
  split a first spectrum based on the first radio frequency signal into a first low-frequency band and a first high-frequency band;
  perform a first Fourier transform to compute a first new spectrum based on the first spectrum;
  compute a first waveform of the first new spectrum with noise of the system reduced by performing a first inverse Fourier transform based on the first new spectrum; and
  combine the first new spectrum with noise of the system reduced with the first low-frequency band.

13. The tangible non-transitory computer-readable storage medium of claim 12, wherein, when executed by the processor, the computer program further causes the system to:
  obtain a measurement of a second radio frequency signal;
  split a second spectrum based on the first radio frequency signal and the second radio frequency signal into a second low-frequency band and a second high-frequency band, wherein the first spectrum is based on the first radio frequency signal and the second radio frequency signal;

perform the first Fourier transform to compute the first new spectrum based on the measurement of the first radio frequency signal and the measurement of the second radio frequency signal, wherein the first new spectrum is of a first common mode signal based on the first radio frequency signal and the second radio frequency signal; and measure a contribution of the system to noise of the first common mode signal by performing a second Fourier transform of a differential mode signal based on the first radio frequency signal and the second radio frequency signal.

14. The tangible non-transitory computer-readable storage medium of claim 13, wherein, when executed by the processor, the computer program further causes the system to:

combine a magnitude of the first new spectrum of the first common mode signal and a phase of the first spectrum; and compute the first waveform of the first new spectrum with noise of the system reduced by performing the first inverse Fourier transform based on the magnitude of the first new spectrum with noise of the system reduced and the phase of the first spectrum.

15. The tangible non-transitory computer-readable storage medium of claim 14, wherein, when executed by the processor, the computer program further causes the system to:

obtain a measurement of a third radio frequency signal and a measurement of a fourth radio frequency signal;

split a third spectrum based on the third radio frequency signal and the fourth radio frequency signal into a third low-frequency band and a third high-frequency band;

split a fourth spectrum based on the third radio frequency signal and the fourth radio frequency signal into a fourth low-frequency band and a fourth high-frequency band;

perform a third Fourier transform to compute a second new spectrum based on the measurement of the third radio frequency signal and the measurement of the fourth radio frequency signal, wherein the second new spectrum is of second common mode signal based on the third radio frequency signal and the fourth radio frequency signal;

measure a contribution of the system to noise of the second common mode signal by performing a fourth Fourier transform of a differential mode signal based on the third radio frequency signal and the fourth radio frequency signal;

combine a magnitude of the second new spectrum of the second common mode signal and a phase of the third spectrum; and compute a second waveform of the second new spectrum with noise of the system reduced by performing a second inverse Fourier transform based on the magnitude of the second new spectrum of the second common mode signal and the phase of the third spectrum.

16. The tangible non-transitory computer-readable storage medium of claim 15, wherein, when executed by the processor, the computer program further causes the system to:

average the first new spectrum and the second new spectrum.

17. The tangible non-transitory computer-readable storage medium of claim 12, wherein, when executed by the processor, the computer program further causes the system to:

estimate a contribution of the system to noise of the first radio frequency signal based on the first radio frequency signal; and perform the first Fourier transform to compute the first new spectrum based on the measurement of the first radio frequency signal; and perform a second Fourier transform to compute a second new spectrum based on the estimated contribution of the system to noise of the first radio frequency signal.

18. The tangible non-transitory computer-readable storage medium of claim 17, wherein, when executed by the processor, the computer program further causes the system to:

combine a magnitude of the first new spectrum and a phase of the first new spectrum; and compute the first waveform of the first new spectrum with noise of the system reduced by performing the first inverse Fourier transform based on the magnitude of the first new spectrum and the phase of the first new spectrum;

obtain a measurement of a second radio frequency signal;

split a second spectrum based on the of the second radio frequency signal into a second low-frequency band and a second high-frequency band;

perform a third Fourier transform to compute a third new spectrum based on the second spectrum;

estimate a contribution of the system to noise of the second radio frequency signal based on the second radio frequency signal;

perform the third Fourier transform to compute the third new spectrum based on the measurement of the second radio frequency signal;

perform a fourth Fourier transform to compute a fourth new spectrum based on the estimated contribution of the system to noise of the second radio frequency signal combine a magnitude of the third new spectrum and a phase of the third new spectrum; and compute a second waveform of the third new spectrum with noise of the system reduced by performing a second inverse Fourier transform based on the magnitude of the third new spectrum and the phase of the third new spectrum.

19. The tangible non-transitory computer-readable storage medium of claim 18, wherein, when executed by the processor, the computer program further causes the system to:

average the first new spectrum and the third new spectrum.

20. A system, comprising:

a memory that stores instructions; and a processor that executes the instructions, wherein, when executed by the processor, the instructions cause the system to:

obtain a measurement of a first radio frequency signal;

split a first spectrum based on the first radio frequency signal into a first low-frequency band and a first high-frequency band;

perform a first Fourier transform to compute a first new spectrum based on the first spectrum;

compute a first waveform of the first new spectrum with noise of the system reduced by performing a first inverse Fourier transform based on the first new spectrum; and combine the first new spectrum with noise of the system reduced with the first low-frequency band.

* * * * *